(12) United States Patent
Dasgupta et al.

(10) Patent No.: US 11,437,255 B2
(45) Date of Patent: Sep. 6, 2022

(54) EPITAXIAL III-N NANORIBBON STRUCTURES FOR DEVICE FABRICATION

(71) Applicant: Intel Corporation, Santa Clara, CA (US)

(72) Inventors: Sansaptak Dasgupta, Hillsboro, OR (US); Marko Radosavljevic, Portland, OR (US); Han Wui Then, Portland, OR (US); Paul Fischer, Portland, OR (US); Kevin Lin, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 189 days.

(21) Appl. No.: 16/642,833

(22) PCT Filed: Sep. 27, 2017

(86) PCT No.: PCT/US2017/053584
§ 371 (c)(1),
(2) Date: Feb. 27, 2020

(87) PCT Pub. No.: WO2019/066789
PCT Pub. Date: Apr. 4, 2019

(65) Prior Publication Data
US 2020/0350184 A1 Nov. 5, 2020

(51) Int. Cl.
*H01L 21/673* (2006.01)
*H01L 21/02* (2006.01)
(52) U.S. Cl.
CPC ...... *H01L 21/6732* (2013.01); *H01L 21/0254* (2013.01); *H01L 21/02241* (2013.01); *H01L 21/02381* (2013.01)

(58) Field of Classification Search
None
See application file for complete search history.

(56) References Cited

U.S. PATENT DOCUMENTS

| 9,070,706 | B2* | 6/2015 | Cho | H01L 29/66522 |
| 2011/0143472 | A1* | 6/2011 | Seifert | B82Y 10/00 |
| | | | | 438/45 |
| 2012/0074524 | A1 | 3/2012 | Baker et al. | |
| 2012/0119218 | A1 | 5/2012 | Su et al. | |
| 2012/0319127 | A1 | 12/2012 | Chowdhury et al. | |

(Continued)

FOREIGN PATENT DOCUMENTS

| WO | WO-2016048328 A1 * | 3/2016 | H01L 29/7786 |
| WO | 2017111852 | 6/2017 | |

OTHER PUBLICATIONS

International Search Report and Written Opinion for International Patent Application No. PCT/US2017/053584, dated Jun. 27, 2018.

(Continued)

*Primary Examiner* — Khaja Ahmad
(74) *Attorney, Agent, or Firm* — Essential Patents Group, LLP

(57) ABSTRACT

A structure, comprising an island comprising a III-N material. The island extends over a substrate and has a sloped sidewall. A cap comprising a III-N material extends laterally from a top surface and overhangs the sidewall of the island. A device, such as a transistor, light emitting diode, or resonator, may be formed within, or over, the cap.

16 Claims, 23 Drawing Sheets

(56) References Cited

U.S. PATENT DOCUMENTS

2016/0056244 A1* 2/2016 Dasgupta .......... H01L 21/30608
257/183
2016/0365435 A1* 12/2016 Then ................. H01L 29/66446
2017/0012130 A1 1/2017 Cai et al.
2017/0025507 A1* 1/2017 Fan ................... H01L 29/42316
2018/0219087 A1* 8/2018 Dasgupta ............ H01L 21/0254

OTHER PUBLICATIONS

International Preliminary Report on Patentability from PCT/US2017/053584 dated Apr. 9, 2020, 12 pgs.

* cited by examiner

EPITAXIAL III-N NANORIBBON STRUCTURES FOR DEVICE FABRICATION

CLAIM OF PRIORITY

This Application is a National Stage Entry of, and claims priority to, PCT Application No. PCT/US2017/053584, filed on Sep. 27, 2017 and titled "EPITAXIAL III-N NANORIBBON STRUCTURES FOR DEVICE FABRICATION", which is incorporated by reference in its entirety for all purposes.

BACKGROUND

Many advanced semiconductor devices utilize materials other than the traditional group IV elements silicon and germanium. Of these, several have wurtzite crystal structures. The III-N materials, in particular GaN due to its large bandgap of 3.4 eV, are finding many applications in high speed power-handing integrated circuits, for example high-power microwave amplifiers and power management electronics. Advanced devices like high-electron mobility transistors (HEMT) employ heterojunctions of GaN with other III-N materials and their alloys, such as AlInN and AlGaN. The large bandgap enables significantly higher breakdown voltages than silicon devices (Si bandgap ~1 eV). In addition, large bandgap III-N materials are being utilized in optoelectronic devices such as blue and UV LEDs. These materials, due to the asymmetric wurtzite unit cell, also display piezoelectric properties, and can be used to produce integrated resonant structures.

The devices described above are mostly large discrete components utilizing bulk materials. There is increasing demand to produce integrated circuits employing miniaturized versions of these devices. To date, devices employing III-N materials have employed multi-chip integration techniques to incorporate III-N based devices with silicon-based devices in an integrated circuit. One approach is to grow epitaxial thin-film layers on silicon to integrate with conventional CMOS devices. However, difficulties in such integration arise primarily due to crystal structure and lattice mismatch between the two materials (~40% between Si and GaN). In addition, there is a significant thermal expansion coefficient mismatch (~116% between Si and GaN). The structural mismatch result in creation of a large density of crystalline defects in thin film III-N structures epitaxially grown on Si substrates. Monocrystalline III-N thin film structures that have low-defect densities are highly desired as a starting point to make various devices described above, but are difficult to fabricate without employing expensive (both in material and labor) thick buffer layers.

In particular, low-defect structures that have a nanometric thickness, such as nanoribbons, which can be made from epitaxial III-N materials such as GaN, are advantageous for fabricating power MOSFETs and HEMTs. These more advanced structures are difficult to fabricate. One reason is a paucity of wet etch chemistries for this material system. Current etch chemistries exhibit poor selectivity and large undercut. To date, techniques to make high-quality (low defect) crystalline III-N structures useful for device fabrication have not been found.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

Figure 1A:
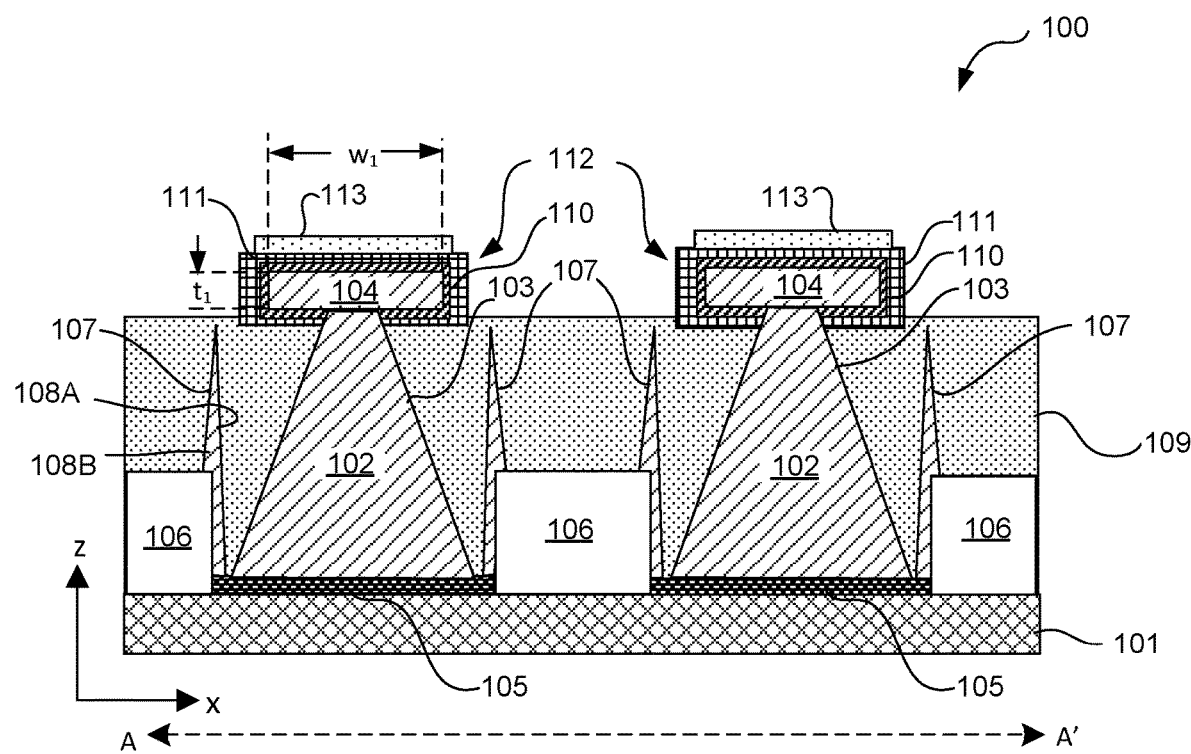
FIG. 1A illustrates a cross-sectional view of a III-N transistor structure in the x-z plane, in accordance with some embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

DETAILED DESCRIPTION

Throughout the specification and in the claims, spatial orientation references are made by the terms "top", "bottom', "under", "adjacent", "side", "below" and "above". These terms indicate position of an object relative to another object.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function.

The term "semiconductor" refers to a material having a negative temperature coefficient of resistance, in contrast to metals, and has an intrinsic carrier density, which can be increased upon doping with impurity atoms or crystal defects.

The term "doping" refers to implantation of impurity atoms in a semiconductor material to increase its majority carrier concentration and thus its conductivity. Both electrons and holes can be majority carriers with n-type or p-type doping, respectively. Highly doped semiconductors have conductivities approaching those of metals, and are indicated by N+ or P+ doping. These can substitute for metals in integrated circuits.

The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Described herein is an epitaxial III-N thin film cap grown from a III-N elevated structure, such as a III-N mesa or island. The islands themselves having wurtzite crystallinity may be grown epitaxially within windows or trenches formed in a masking layer on a substrate. The substrate may be silicon or 3C-SiC having a cubic crystallinity, for example. A III-N island may first grow vertically, parallel to the c-axis of the layer while growth is confined within the trench, advancing a (0001) plane. Under suitable growth conditions, the island may begin to grow laterally after exceeding the trench height. During this stage, inclined side facets are free to propagate. These inclined sidewall facets may intersect the (0001) plane (c-plane) at approximately 60° angles. For example, the inclined sidewall facets may be parallel to the {11-22} and {1-101} semi-polar crystal planes, which form angles of 58.4° and 61°, respectively, with the c-plane. As the island grows, it may take on a pyramidal shape, and then develop a trapezoidal profile. During growth, the inclined facets may intersect any vertically propagating defects and deflects them horizontally. Relatively few defects may therefore reach the top (0001) plane of the III-N epitaxial island, providing an epitaxial surface having a lower defect density. From this surface, additional epitaxial cap layers can be grown having even lower defect densities.

With the advancement of epitaxial films and other crystalline structures described herein, new microstructures are possible that can lead to useful integrated electronic devices. An example is the III-N material system, which has found wide use in the fabrication of high power and high speed transistors, blue and UV LEDs, and AlN in piezoelectric devices, to name a few current applications. The structures described herein may be fabricated on a wide array of substrates. For example, the structures described herein may be fabricated on substrates that are often employed for III-N devices, such as silicon carbide (SiC). The structures described herein may also advance the use of other substrate materials that are more challenging, such a silicon substrates. Lattice mismatch between GaN and Si is as much as 40%. As such, epitaxial growth of high quality III-N layers that have low defect densities on Si substrates is difficult without first growing relatively thick III-N or silicon nitride buffer layers to avoid introduction of defects such as threading dislocation defects into the crystalline III-N layer. These types of defects typically propagate vertically, parallel to the c-axis of a III-N layer when grown on a bare Si surface. Threading dislocation defects are also propagated as epitaxial layers are grown.

The inventors have found that a III-N thin cap grown on top III-N islands by lateral epitaxial overgrowth (LEO) can reduce defect density within the film portion extending from the island. Under specific conditions of LEO, threading dislocation defects primarily propagate vertically, with little horizontal propagation, leaving a defect-free peripheral region of the cap that can be further employed for fabricating devices. The inventors have further found that under suitable processing conditions side facets of the islands may be decomposed, transforming an island having a mesa profile into a peaked ridge that has sidewalls of steeper slope. Decomposition may be preferential at the intersection of the (0001) plane and the inclined sidewall facets, retaining a portion of the (0001) plane as the inclined facets retreat toward a centerline of the island. A III-N cap having one or more III-N material layers may then be grown on top of these eroded III-N islands by further changing growth conditions (e.g., temperature and partial pressures) to promote LEO from the island top. The resulting III-N cap may cantilever from the top surface of the III-N islands, overhanging sidewalls of the III-N islands. Due, in part, to the high mechanical strength of III-N crystals, the III-N cap may exhibit exceedingly high area to thickness ratios, with nanometric thickness and multiple-micron lengths and widths, for example. When grown on an island having a length significantly greater than its width, the III-N cap is ribbon-like. The III-N cap has proven to be robust, and the form factor is suitable for III-N based transistors as well as many other III-N devices. Methods to fabricate transistors, LEDs and piezoelectric resonators from the III-N cap are described further below.

FIG. 1A illustrates a cross-sectional view of a III-N transistor structure 100 in the x-z plane, in accordance with some embodiments of the disclosure. Transistor structure 100 comprises island 102 on substrate 101. In some embodiments, island 102 has sloped lateral sidewalls 103 extending from the base and intersecting at the top of island 102, giving island 102 a peaked or trapezoidal profile. In some embodiments, the slope angle of sidewall 103 is approximately 60° with respect to the plane of the substrate in some embodiments. Cap 104 extends laterally from the top of island 102 and overhangs sidewalls 103. In the illustrated embodiments, island 102 is a ridge-like structure having a length extending in the y-dimension above and below the plane of the figure, with cap 104 extending along the length of the ridge. In some embodiments, cap thicknesses $t_1$ ranging between 1 and 50 nanometers (nm) and a width $w_1$ ranging between 1 and 20 microns. Width $w_1$ of cap 104 is variable, and may be engineered to optimize packing density of transistors 114 along the x-dimension. In some embodiments, the thickness $t_1$ of cap 104 scales with its width, and is controllable by cap growth conditions.

Island 102 and cap 104 comprise monocrystalline III-N materials such as GaN, AlN InN, InGaN, InAlN, etc. The material compositions may be stoichiometric or non-stoichiometric. In some embodiments, nucleation layer 105 is disposed between substrate 101 and island 102. Nucleation layer 105 has a thickness ranging between 1-10 nm, and comprises a III-N material such as AlN, InN, and InAlN. Other III-N materials are possible. In the illustrated embodiment, island 102 is confined within trenches in first dielectric layer 106, and has a z-height that extends above first dielectric layer 106. First dielectric layer 106 includes, but is not limited to, silicon oxide, silicon nitride, silicon oxynitride, silicon carbide, etc. In some embodiments, substrate 101 is a particular facet or crystal plane of a cubic group IV material such as silicon, germanium, SiGe, silicon carbide, or a III-V material such as GaAs, InAs, InP. Other materials are also possible, such as sapphire substrates, as well as amorphous substrates such as soda-lime glass and fused silica substrates.

As will be described below, island 102 has a comparatively low defect density due to the mechanism of the epitaxial growth confined within trenches formed in first dielectric layer 106. The low number of defects on the top region of island 102 and the small lateral dimensions of the top surface of island 102 facilitates high crystal quality in cap 104. The small lateral dimensions of the top surface of island 102 may be a result of preferential decomposition of a portion of a precursor III-N structure that was grown from nucleation layer 105.

As further shown in FIG. 1A, island 102 is flanked by at least one ridge 107. Ridge 107 is a remnant of a peripheral portion of the precursor III-N structure that was grown from nucleation layer 105. Ridge 107, resulting from the decomposition of the precursor structure, may be completely separated from island 102, or may remain as a perimeter ring surrounding island 102. In some embodiments, ridge 107 comprises the III-N material of island 102. Ridge 107 has a first sidewall 108A facing island sidewall 103 and a second sidewall 108B on the side of ridge 107 facing away from island sidewall 103. In the illustrated embodiments, first sidewall 108A has a steeper slope than island sidewall 103, (e.g., >60° with respect to the substrate surface). Second sidewall 108B may have an angle of approximately 60° as a result of the growth process employed to form the precursor structure. In some embodiments, ridge 107 extends over edges of first dielectric layer 106, as a result of a LEO process employed for the precursor feature.

Island 102, first dielectric layer 106 and ridge 107 are embedded or partially embedded in a second dielectric layer 109, according to some embodiments. In some embodiments, island 102 has a z-height that is substantially planar with second dielectric layer 109. In other embodiments, island 102 has a z-height that extends above second dielectric layer 109. In some embodiments, second dielectric layer 109 is a backfill dielectric, and may comprises a material including, but not limited to, stoichiometric and non-stoichiometric compositions of silicon nitride, silicon oxynitride, silicon dioxide, carbon-doped oxide, or other low-k dielectrics having a relative permittivity of 3.5, and below. In some embodiments, second dielectric layer 109 is under tensile tress. As an example, silicon nitride films can have tensile stress when deposited under certain conditions. Tensile stress within the film can place the III-N precursor structure under tensile strain, which may increase the rate of preferential decomposition of the precursor structure and promote the formation of island 102.

Referring again to FIG. 1A, cap 104 is clad by a polarization layer 110 covering one or more of the surfaces of cap 104. In some embodiments, polarization layer 110 comprises a III-N material and is a heterolayer on cap 104. Polarization layer 110 creates a two-dimensional electron gas (2DEG) on suitably polarized surfaces of cap 104 that interface with polarization layer 110. As cap 104 is a quasi-two dimensional structure, the 2DEG is a carrier channel within the interior of cap 104. The quasi-two dimensional structure of cap 104 is advantageous for fabrication of high-electron mobility transistors (HEMT). In some embodiments, polarization layer 110 extends over the length of cap 104. Examples of the III-N material of polarization layer 110 include, but are not limited to, AlN, AlInN, or AlGaN.

Still referring to FIG. 1A, a gate dielectric 111 overlays sections of polarization layer 110. Gate dielectric 111 may include a material having a high dielectric constant, which in some embodiments is larger than that of silicon nitride ($\kappa \geq 9$). Gate dielectric 111 may include materials such as, but not limited to, hafnium dioxide ($HfO_2$), zirconium dioxide ($ZrO_2$) and titanium dioxide ($TiO_2$), Al2O3, SiO2, SiN etc. In some embodiments, polarization layer 110 and gate dielectric 111 extend over edges of cap 104, covering edges and at least part of the bottom surface of cap 104 in a gate wrap-around configuration. Gate terminal 113 is a conductive layer over gate dielectric 111, and may include materials such as, but not limited to, copper, nickel, TiN, W, polysilicon hafnium, zirconium, titanium, tantalum, aluminum, alloys of these metals, and carbides of these metals (e.g., hafnium carbide, zirconium carbide, titanium carbide, tantalum carbide, and aluminum carbide).

Figure 1B:
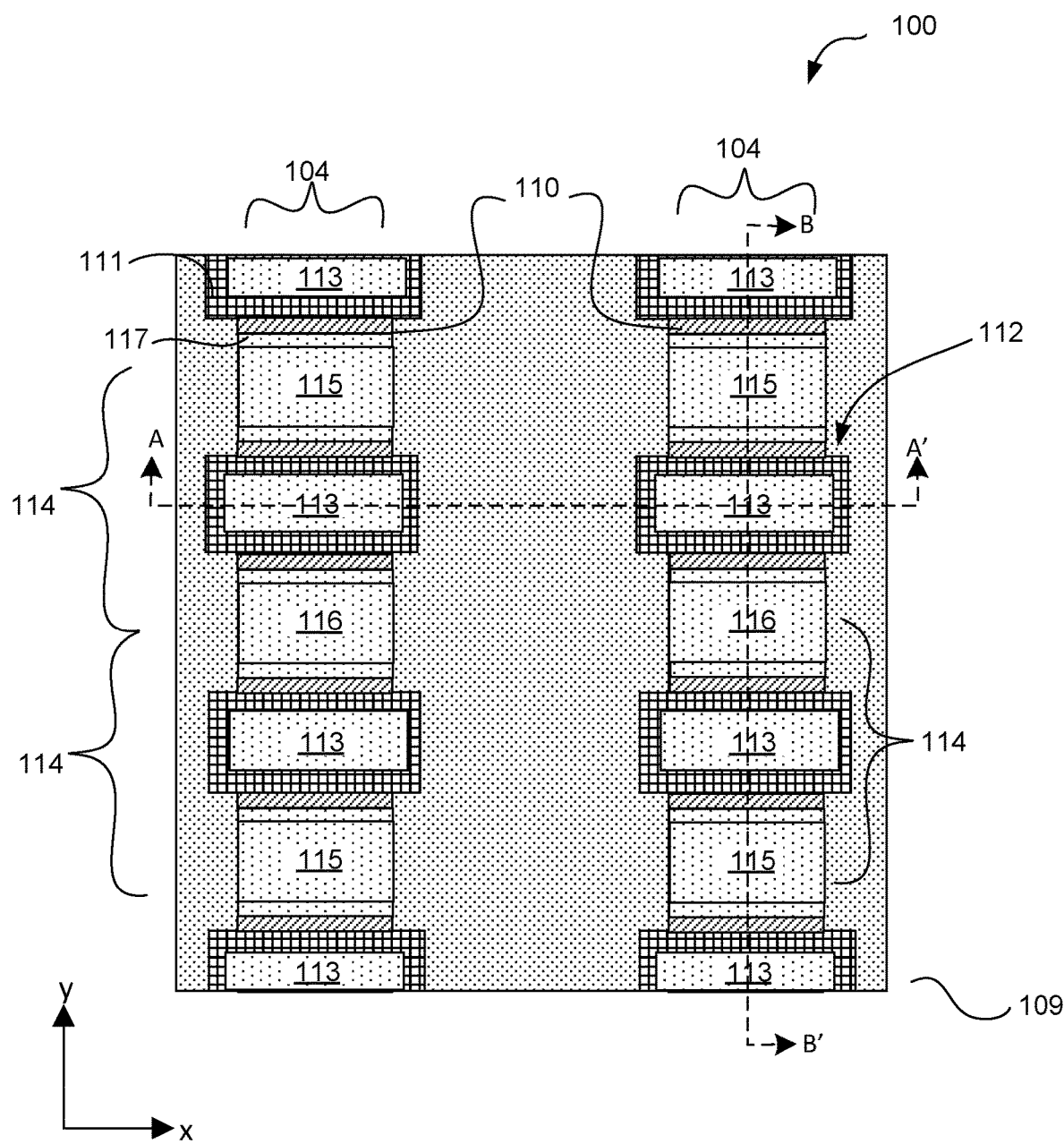
FIG. 1B illustrates a plan view of the III-N transistor structure in the x-y plane, in accordance with some embodiments of the disclosure.

FIG. 1B illustrates a plan view of transistor structure 100 in the x-y plane. Structures that are embedded in second dielectric 109 in FIG. 1A are not shown. In some embodiments, transistor structure 100 comprises repeating copies of cap 104 in both the x and y dimensions. For spatially extensive arrays of transistors 114, multiple copies of cap 104 may be repeated in rows along the y-dimension as well as in the x-dimension. The plan view shows a particular device layer configuration where gate stack 112 is distributed along the length of cap 104. Cap 104 is a unitary structure according to some embodiments. In other embodiments, cap 104 is segmented into separate structures. Drain terminal 115 and source terminal 116 are immediately adjacent to gate stack 112. As will be shown in FIG. 1C, drain terminal 115 and source terminal 116 comprise a N+ III-N semiconductor sublayer in contact with cap 104, and a metal contact layer overlaying the N+ semiconductor sublayer. The metal contact layer 117 of drain terminal 115 and source terminal 116 is visible in the plan view of FIG. 1B. In some embodiments, drain terminal 115 and source terminal 116 are shared between adjacent transistors 114. In some embodiments, cap 104 has a length ranging between one and several hundred microns to several millimeters extending in the y-dimension, permitting the colocation of multiple copies of transistors 114 distributed along the length of cap 104.

Figure 1C:
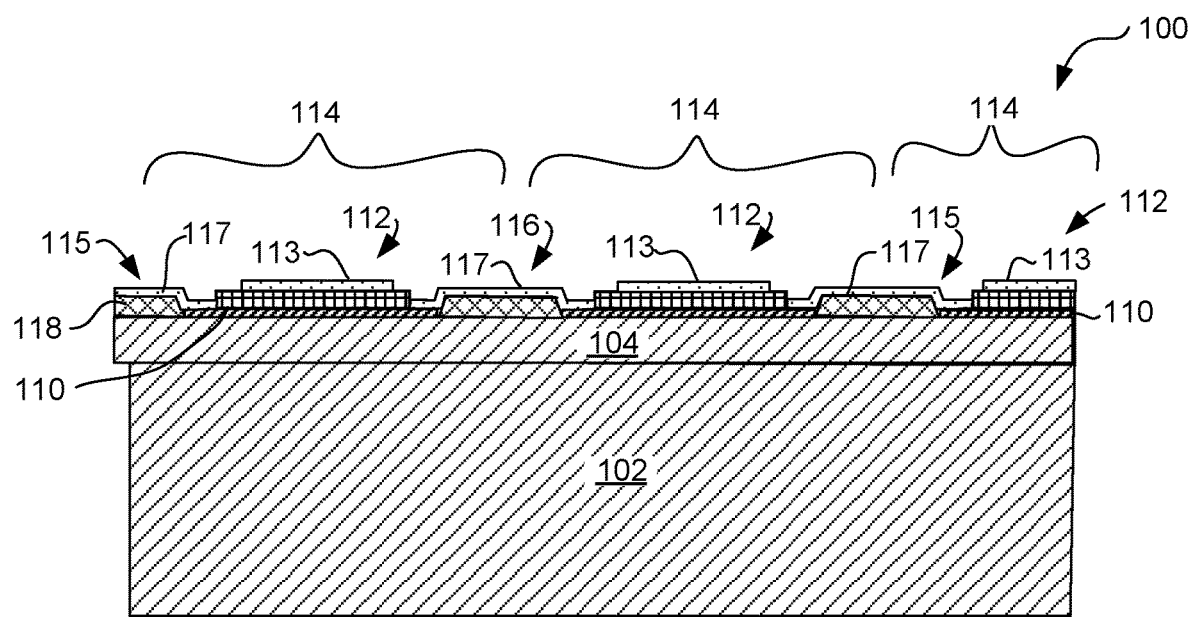
FIG. 1C illustrates a cross-sectional view of an underside source and drain terminals in a III-N transistor structure in the x-z plane, according to some embodiments of the disclosure.

FIG. 1C illustrates a cross-sectional view of transistor structure 100 taken along vertical cut B-B' in FIG. 1B. Drain terminal 115 and source terminal 116 of transistors 114 are shown in cross-section, comprising semiconductor sublayer 118, and overlying metal contact layer 117. Semiconductor sublayer overlays cap 104 through an opening in polarization layer 110. In some embodiments, semiconductor layer 118 is an epitaxial layer on cap 104 In some embodiments, polarization layer 110 abuts semiconductor sublayer 118. In some embodiments, semiconductor sublayer 118 comprises an heavily doped III-N material comprising a group IV impurity, such as silicon, imparting to the III-N material a large conductivity. In some embodiments, the impurity concentration is sufficient create a N+ doping level. In some embodiments, semiconductor sublayer 118 comprises N+ GaN or N+ InGaN. Overlying metal contact layer 117 forms an ohmic contact with semiconductor sublayer 118, and comprises metals such as, but not limited to, titanium, tungsten, molybdenum, cobalt, aluminum, etc. Drain terminal 115 and source terminal 116 are distributed along the length of cap 104, on opposing sides of gate stack 112. In some embodiments, adjacent transistors 114 share drain terminal 115 and source terminal 116, as shown in FIGS. 1B and 1C. In other embodiments, such as shown in FIG. 2, transistors 114 each have separate drain and source terminals.

Figure 1D:
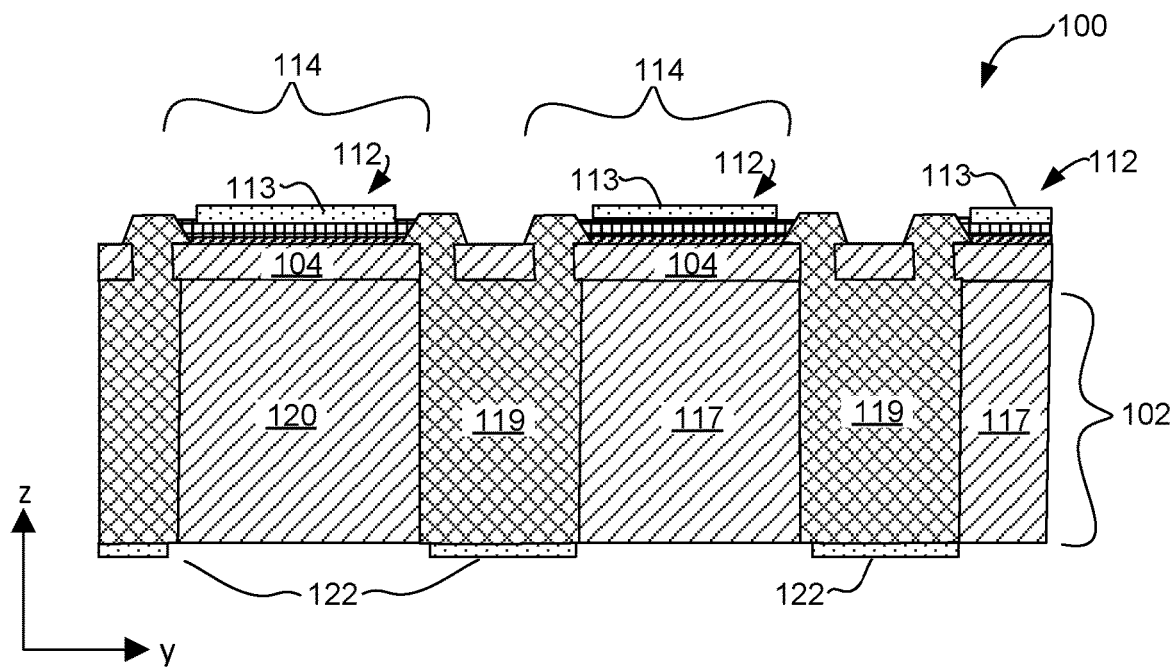
FIG. 1D illustrates a plan view of the III-N transistor structure of FIG. 1C in the x-y plane, having underside source and drain terminals, according to some embodiments of the disclosure.

FIG. 1D illustrates a cross-sectional view of an underside source and drain terminal interconnect architecture in transistor structure 100. Island 102 comprises alternating conductive regions 119 and resistive regions 120. Connections to drain terminal 115 and source terminal 116 are shown as vias 121 extending through cap 104 from conductive regions 119 below cap 104. Tops of vias 121 expand laterally to abut polarization layer 111 and gate stack 112, having a proximal colocation with the 2DEG induced by polarization layer 110 for maximal collection of current. Metal contact layers 122 provide bottom side contacts to conductive regions 119.

Conductive regions 119 comprise heavily doped regions of island 102. In some embodiments, conductive regions 119 comprise silicon or other group IV element impurity, and are doped N+. In other embodiments, the III-N material comprises magnesium or other group II element impurity, and have p-type conductivity. Electrodes 122 are disposed on the bottom of conducive regions 119 for interconnections to drain 115 and source 116. Advantageously, this approach allows backside contacts to transistors 114, facilitating higher device density and/or topside interconnect routing. As an example, backside contacts may include vias through an underlying substrate (not shown).

Figure 2:
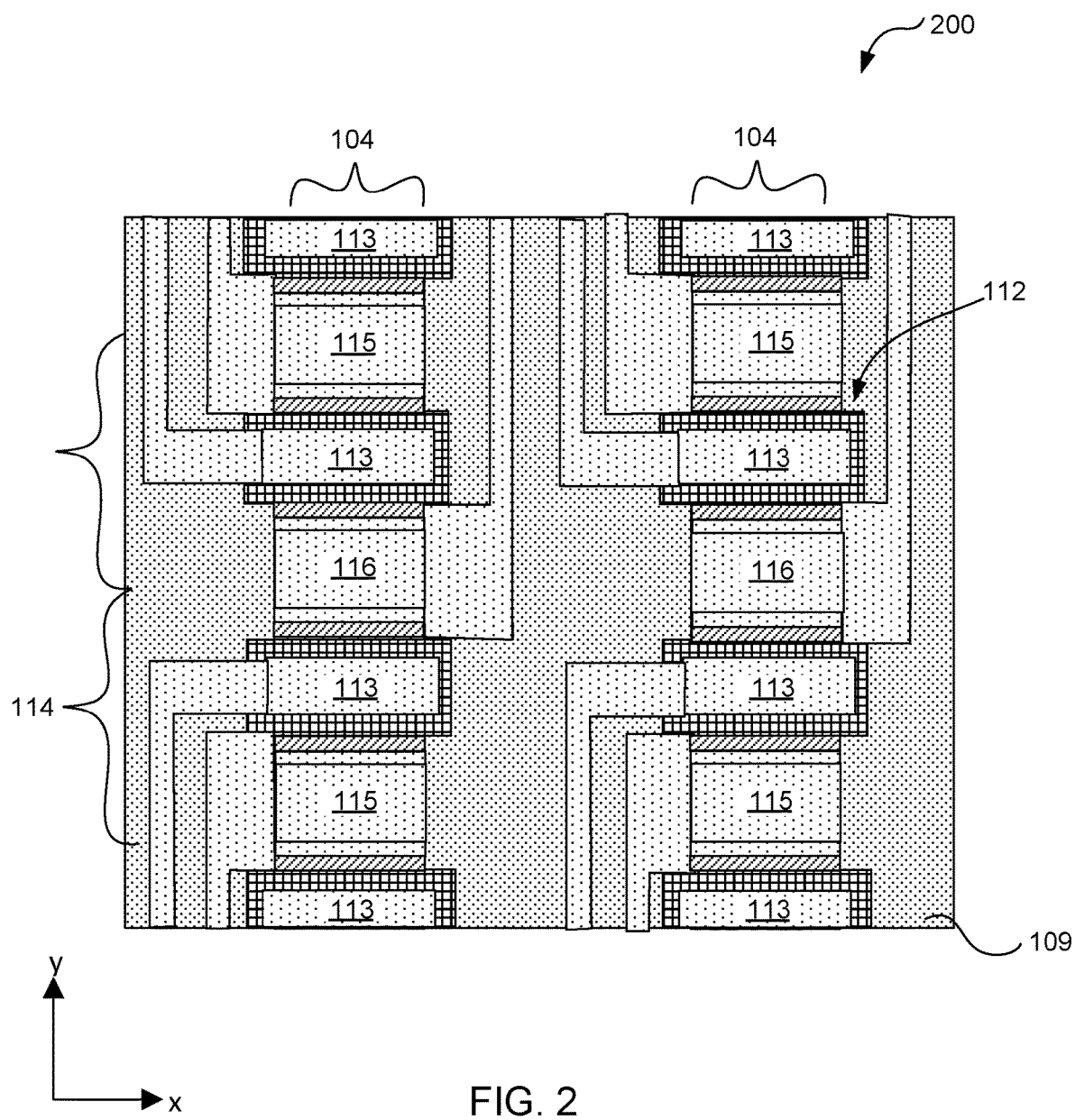
FIG. 2 illustrates a plan view of the III-N transistor structure in the x-y plane having multiple isolated transistors, in accordance with some embodiments of the disclosure.

FIG. 2 illustrates a plan view of III-N transistor structure 200, showing conductive interconnects 201 routed to gate terminal 113, drain terminal 115 and source terminal 116 of transistors 114. In some embodiments, cap 104 is substantially planar with second dielectric layer 109, allowing device terminals embodied as gate terminal 113, drain terminal 115 and source terminal 116 to be accessible for top-side interconnect routing. Conductive interconnects 201 comprise materials such as, but not limited to, copper, copper alloys, aluminum and alloys of aluminum, nickel, tungsten, polysilicon, etc.

Figure 3:
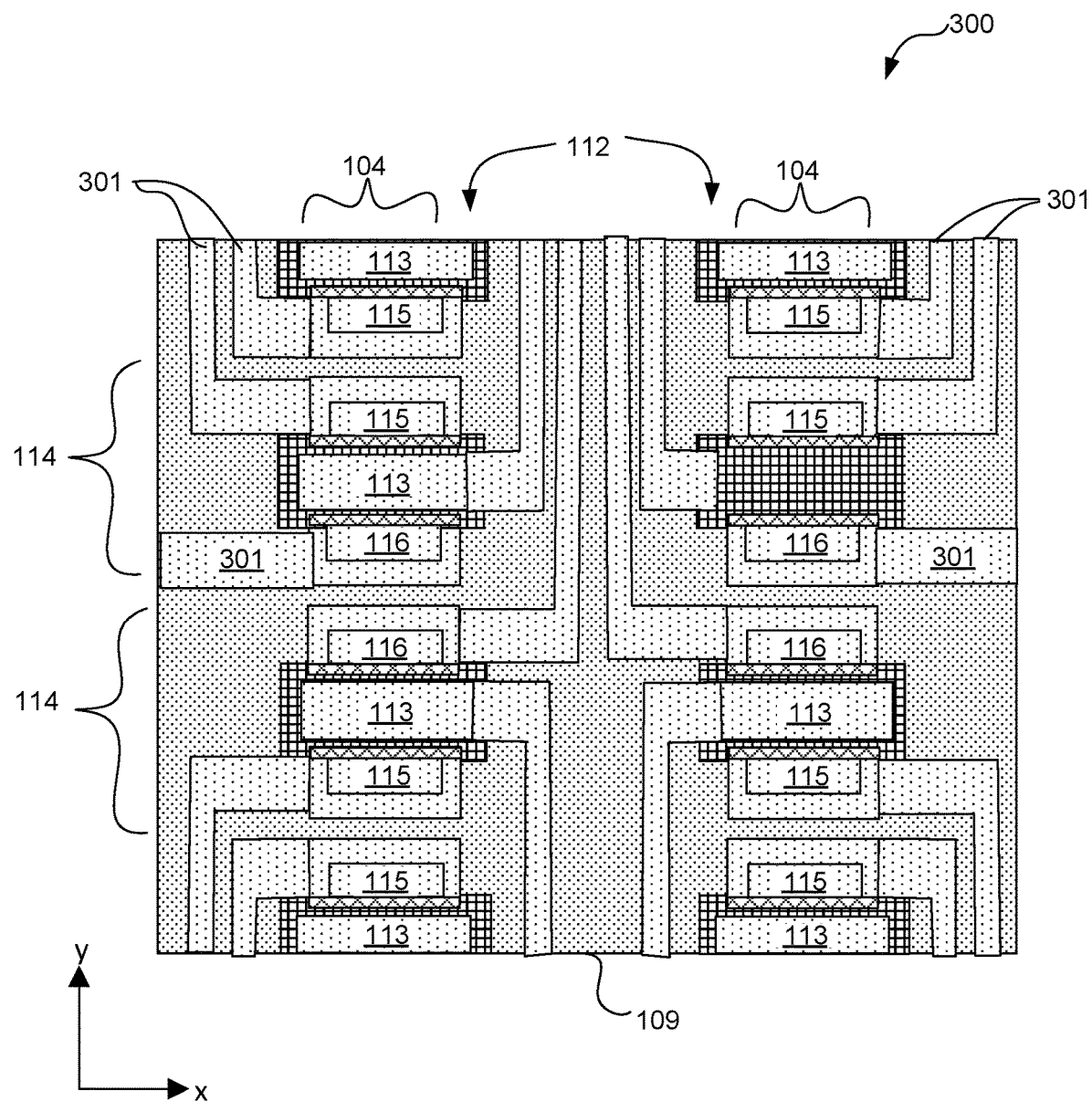
FIG. 3 illustrates a plan view in the x-y plane of a III-N transistor structure, showing multiple transistors with interconnect routing metallization connecting to source, drain and gate terminals, in accordance with some embodiments of the disclosure.

FIG. 3 illustrates a plan view of a transistor structure 300, where cap 104 is segmented into separated regions of cap 104. individual transistors 114 are distributed on the separated regions of cap 104. In some embodiments, cap 104 is subdivided from a continuous strip of cap 104 by an etch process, and separate regions of cap 104 are distributed along a continuous island. In other embodiments, separate regions of cap 104 are on separate islands. In the illustrated embodiment, drain terminal 115 and source terminal 116 are distributed on opposing sides of gate stack 112 along the length of cap 104, and are not shared between adjacent transistors 114. Transistors 114 are symmetrical, and drain terminal 115 and source terminal 116 are interchangeable. Conductive interconnects 201 are also shown in FIG. 3, routed to each drain terminal 115 and source terminal 116, as well as gate terminal 113.

Figure 4A:
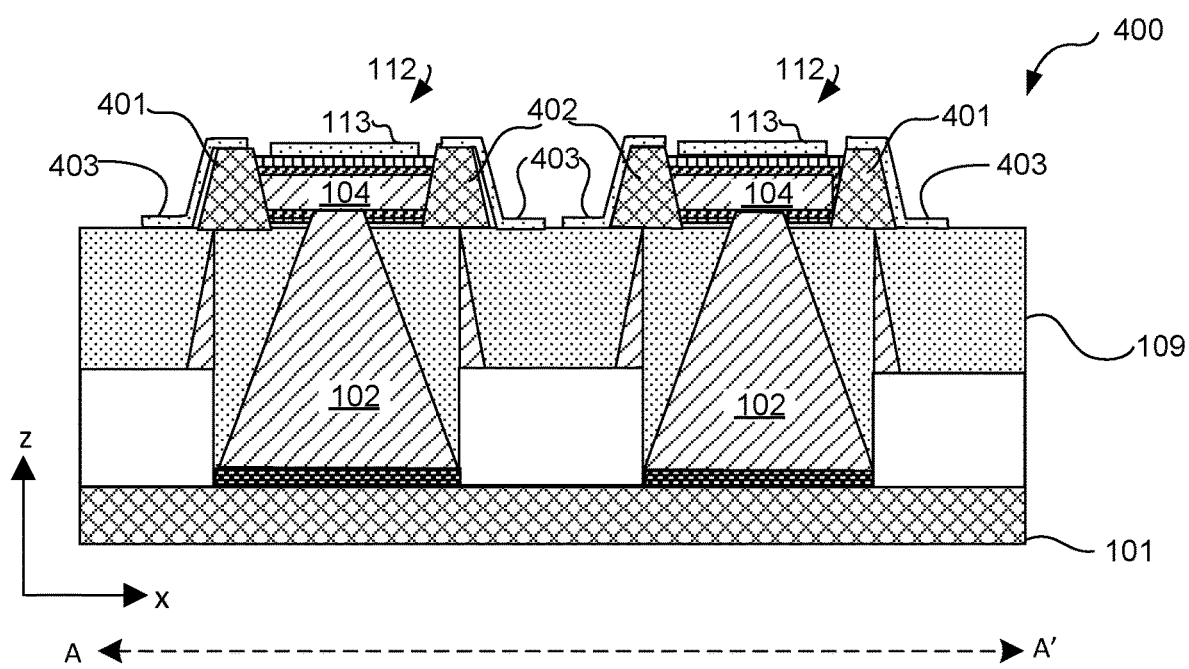
FIG. 4A illustrates a cross-sectional view of a III-N transistor structure in the x-z plane, with raised lateral III-N source and drain terminals and metallization, in accordance with some embodiments of the disclosure.
Figure 4B:
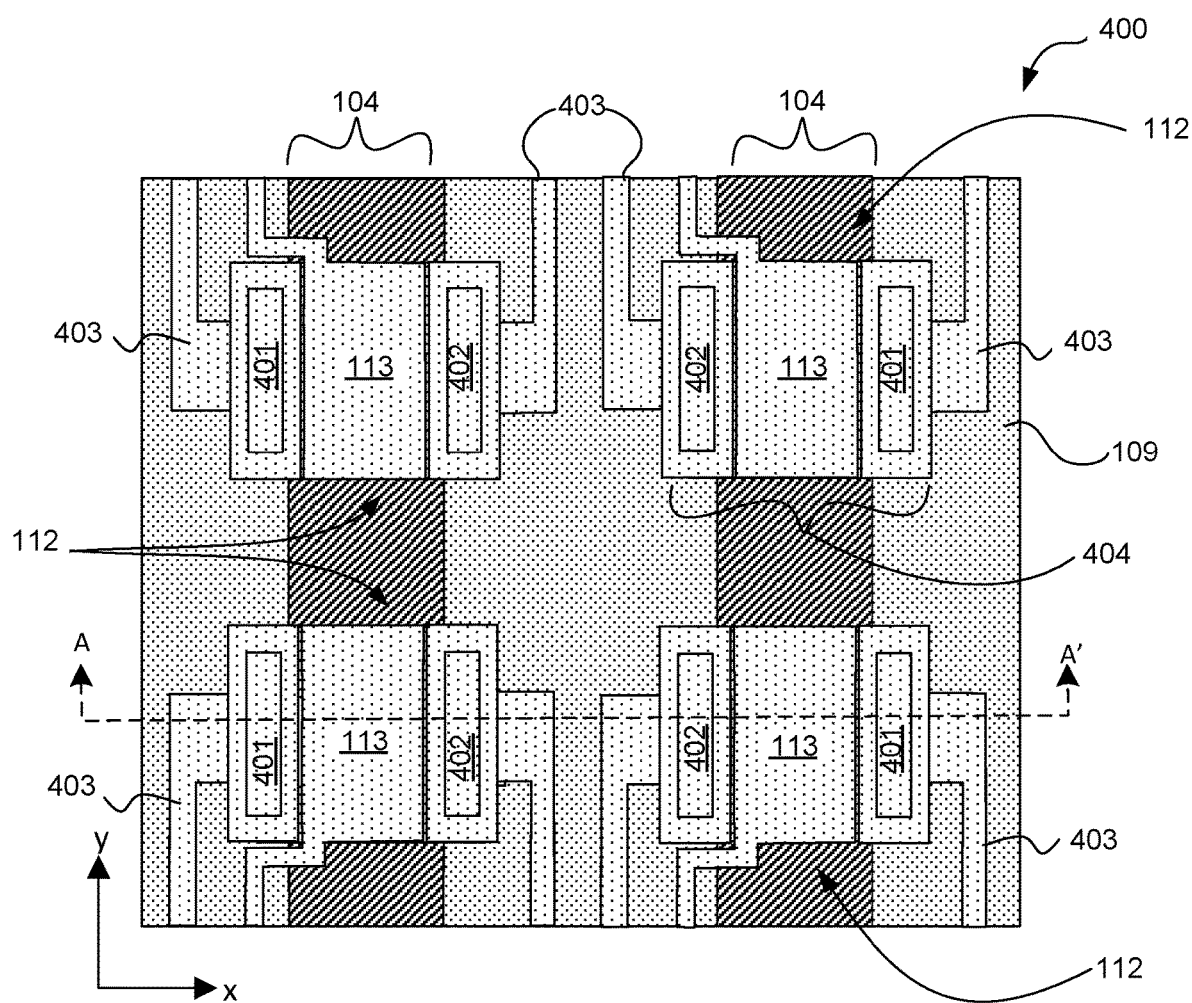
FIG. 4B illustrates a plan view of the III-N transistor structure in the x-y plane, showing multiple individual transistors with raised lateral III-N source and drain terminals and interconnect metallization, in accordance with some embodiments of the disclosure.

FIG. 4A illustrates a cross-sectional view of transistor structure 400, taken from cut line A-A' in FIG. 4B. FIG. 4A shows raised source terminal 401 and raised drain terminal 402 configured orthogonally to those of transistor structure 100. In the illustrated embodiment, source terminal 401 and drain terminal 402 extend laterally from gate stack 112, and overlap the edges of cap 104 second dielectric 109. In symmetric transistor embodiments, source terminal 401 and drain terminal 402 are interchangeable. In some embodiments, source terminal 401 and drain terminal 402 comprise a III-N material, such as, but not limited to, GaN, InGaN, AlInN, etc. Having a composition and lattice constant similar to that of cap 104, source terminal 401 and drain terminal 402 are epitaxial structures on cap 104 and may have few defects. In some embodiments, the III-N material comprises silicon or another group IV element in sufficient quantities to render the III-N material n-type (e.g., N+). In the example shown in FIG. 4A, source terminal 401 and drain terminal 402 comprise silicon-doped GaN. In other embodiments, the III-N material comprises magnesium or other group II element impurity, and have p-type conductivity.

FIG. 4B illustrates a plan view of transistor structure 400, showing source and drain terminals configured orthogonally to those of transistor structure 100. Conductive interconnects 403 are routed to the transistor terminals over the topside of transistor structure 400. The lateral orientation of source terminal 401 and drain terminal 402 across gate stack 112 may be advantageous for increasing the density of transistors 404 within cap 104.

The III-N transistor embodiments described above may be produced by a variety of fabrication methods, each utilizing different techniques and process flows to arrive at the same or similar structures. All methods have in common the ability to epitaxially grow a III-N cap, such as cap 104, from a top of an elevated III-N structure, such as island 102. The fabrication of III-N structures such as island 102 and cap 104 is the starting point for arriving at III-N transistors and other III-N devices, as shown above. One exemplary method for fabrication of III-N transistors on cap 104 is further described below.

Figure 5A:
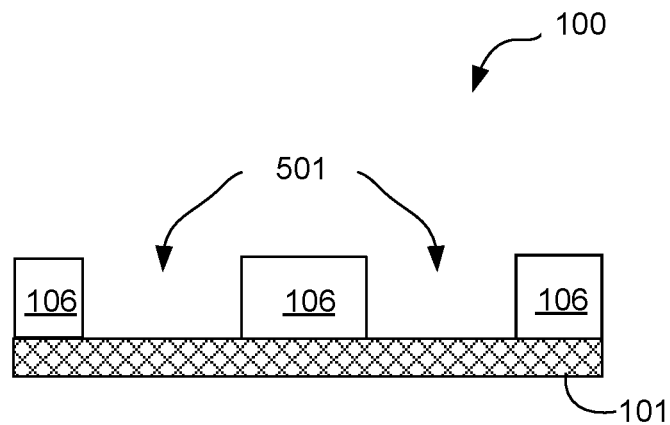
FIGS. 5A-K illustrate cross-sectional views illustrating the evolution of an III-N transistor structure during an exemplary fabrication process, in accordance with some embodiments of the disclosure.

FIGS. 5A-5K depict an exemplary process for fabrication of III-N transistors having one or more features of embodiments described above and arriving at transistor structure 100. In FIG. 5A, the process begins with substrate 101, which in some embodiments is a (111) silicon wafer, and in other embodiments is a (100) silicon wafer. In other embodiments, other crystalline surfaces of silicon may be employed. Other materials may also be substituted for silicon, for example, SiGe, SiC, GaAs, InGaAs, InP, etc. as well as sapphire, aluminum oxide, soda-lime glass and fused silica. A first dielectric layer 106 is disposed over substrate 101, and may be formed by depositing a layer of silicon oxide (SiO) over substrate 101. Other materials may be substituted for silicon oxide; for example, silicon nitride (SiN), silicon oxynitride (SiON), silicon carbide (SiC), silicon carbonitrides (SiCN), or low-K materials, such as carbon doped silicon dioxide (SiOC), porous dielectrics, etc. Materials for making first dielectric layer 106 are not limited to the afore-mentioned examples, and may be any suitable dielectric material. Various deposition methods may be employed to deposit dielectric layer 106. Chemical vapor deposition methods such as metal organic chemical vapor deposition (MOCVD) is one such technique. Other techniques include, but are not limited to, low pressure chemical vapor deposition (LPCVD) and plasma enhanced chemical vapor deposition (PECVD), physical vapor deposition such as sputtering, and liquid phase deposition methods. Trenches 501 in first dielectric layer 106 expose underlying substrate 101 in defined geometries for growth of epitaxial islands, such as island 102, within trenches 501.

Figure 5B:
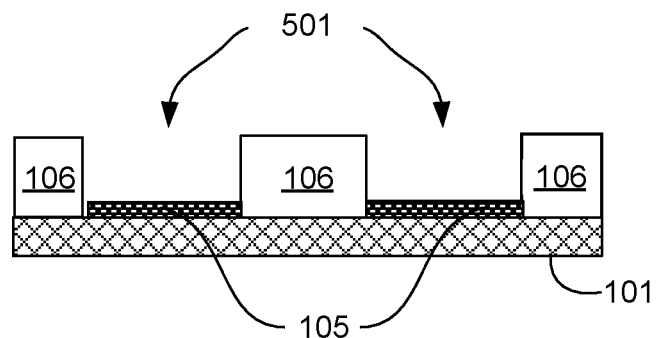

Trenches 501 extend in the y-dimension, and may have any rectangular aspect ratio in the x-y plane. In some embodiments, trenches 501 are stripes, having a length extending in the y-dimension that is several times their width extending in the x-dimension. In some embodiments, trenches 501 extend along predetermined crystalline directions to facilitate epitaxial growth of III-N islands, such as island 102. In FIG. 5B, nucleation layer 105 is deposited within trenches 501. In some embodiments, nucleation layer 105 is optional and this step is omitted. Nucleation layer 105 comprises a III-N material, including, but not limited to, GaN, AlN, AlInN, or AlGaN, and may be deposited by molecular beam epitaxy (MBE) and MOCVD. Under most growth conditions, nucleation layer 105 selectively adheres to exposed substrate 101 with trenches 501 and forms thereupon. In some embodiments, nucleation layer 105 does not favor growth on first dielectric layer 106, which is in some embodiments is polycrystalline. However, in some embodiments, an amorphous layer of the III-N material comprised by nucleation layer 105 forms on first dielectric 106.

Figure 5C:
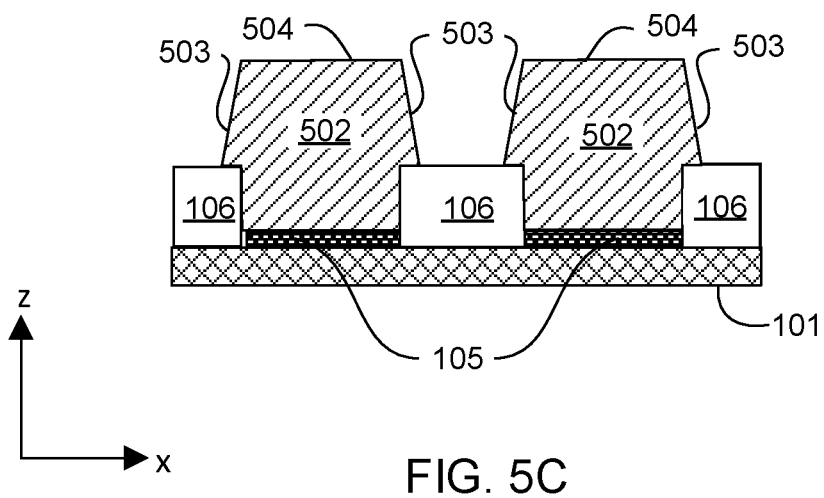

In FIG. 5C, III-N precursor island 502 is grown epitaxially under a first set of growth conditions, comprising temperature, pressure, and N/Ga (or other group III element) precursor ratio for MOCVD. According to some embodiments, initiation of precursor island 502 occurs on nucleation layer 105. In other embodiments, growth of precursor island 502 initiates directly on substrate 101. Growth occurs first vertically within the confines of trenches 501, where growth of precursor island 502 is primarily oriented along the c-axis, which in some embodiments, is substantially normal to the substrate surface (the (100) or (111) surface of Si, for example). After reaching the height of trenches 501, lateral growth of precursor island 502 over first dielectric 106 initiates when the aforementioned inclined facets 503 are free to grow outside trenches 501. Conditions in the deposition chamber are changed at this point to encourage lateral growth. By selection of a second growth temperature, second growth pressure and second N/III precursor ratio (for MOCVD growth) lateral growth of the inclined facets begins over the surface of first dielectric 106 at a rate that that is as fast or faster than vertical growth. In some embodiments, the growth regime is lateral epitaxial overgrowth (LEO).

In an exemplary embodiment of the growth process of precursor island 502, the temperature within a controlled atmosphere chamber is raised from the first growth temperature to a second growth temperature in the range of 950° C. to 1150° C., and a first growth pressure is lowered to a second growth pressure in the range between 30-350 torr. A first N/Ga precursor ratio is raised to a second precursor ratio of 100-5000 $NH_3$/TMG (TMG is trimethylgallium). In some embodiments, the lateral to vertical growth rate is at least 1.5:1, and in other embodiments the lateral:vertical growth rate is 2:1 or higher. During lateral epitaxal overgrowth, defects, such as the threading defects described above that grow along glide planes, are deflected horizontally as they encounter the growing inclined facets. These facets continue to grow vertically, eventually intersecting at a centerline to form a triangular or peaked profile.

As the LEO process continues, the peak expands laterally to form a trapezoidal profile, as shown in FIG. 5C. The top surface 504 is the (0001) plane, and is substantially parallel to the surface of substrate 101. During growth, most of the threading defects propagated horizontally to terminate on inclined planes 503, forming dislocations and point defects on those lateral surfaces. The resulting (0001) plane at island top surface 504 provides a surface with a very low defect density for initiation of epitaxial growth of cap 104 in a later operation.

Figure 5D:
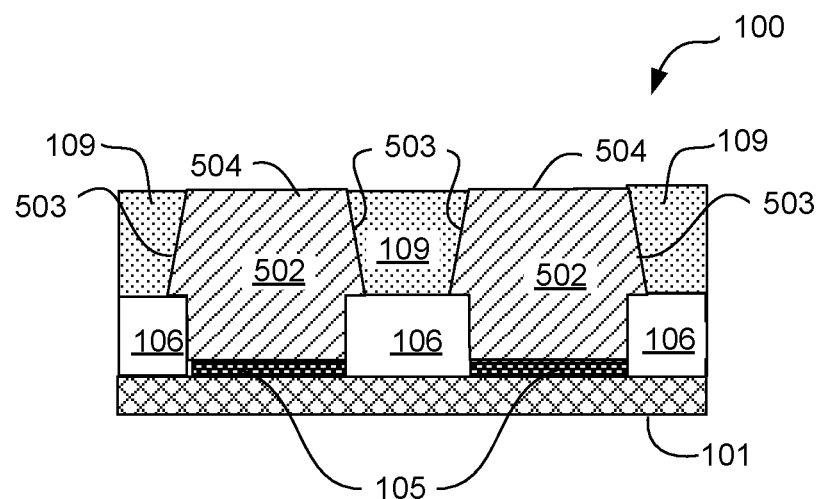

In FIG. 5D, a planarization operation is performed by depositing dielectric fill material 109 after growth of precursor island 502. According to embodiments, the dielectric backfill layer is planar with precursor island 502. Second dielectric 109 includes, but not limited to, silicon nitrides (SiN) and silicon oxynitrides (SiON). Deposition methods include MOCVD or physical vapor deposition methods such as sputtering. Other suitable deposition methods are also possible. As a result of deposition conditions, second dielectric layer 109 is under tensile stress, and pulls on sidewalls 503. The tensile stress can cause cracks and fracturing of precursor island 502, otherwise weaken the structure near sidewalls 503.

Figure 5E:
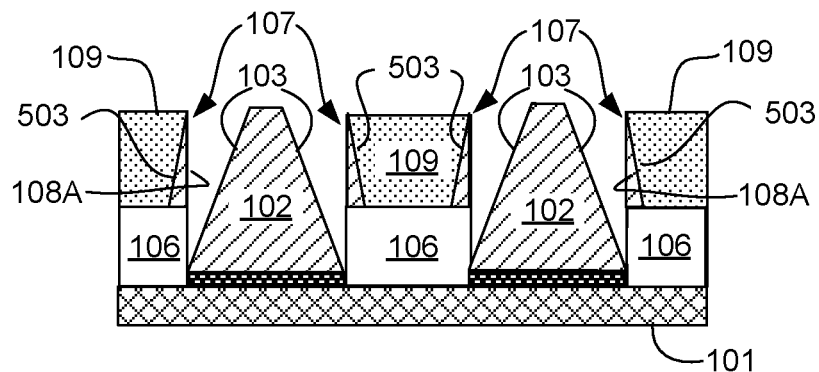
Figure 5F:
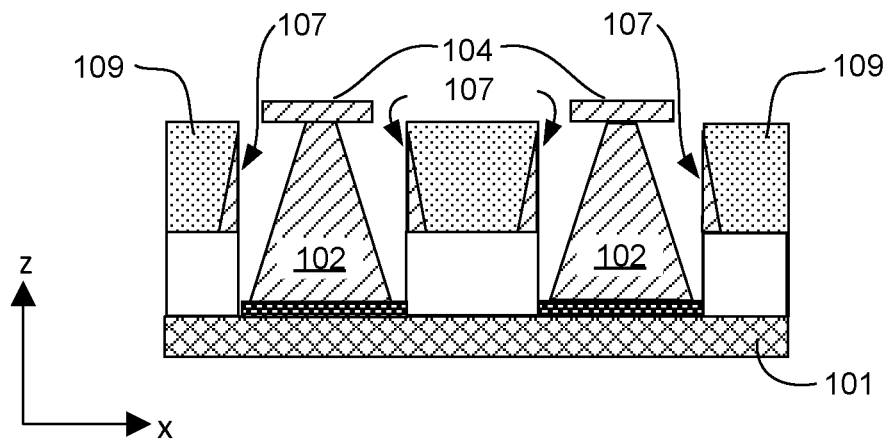

After the planarization operation, precursor island 502 is again subjected to a controlled atmosphere, and to another high temperature regime. In some embodiments, the controlled atmosphere comprises hydrogen with a decreased concentration of nitrogen or nitrogen-bearing gases, such as ammonia, relative to the nitrogen levels used during growth of island 102. The ratio of hydrogen to nitrogen is such that decomposition of the III-N material of island 102 is favored under the imposed temperature regime, which in some embodiments is between 600° C. to 1000° C. Under these conditions, the III-N material of precursor island 502 erodes preferentially to form sidewalls 103, and ridge 107. During the decomposition process, sidewalls 103 retreat toward the center to form island 102. Fragments of sidewalls adhering to second dielectric material 109 form ridge 107. In some embodiments, island 102 is a ridge-like structures having sloped sidewalls 103 extending from substrate 101 (or nucleation layer 105), and terminating at an apex comprising the (0001) plane. This island geometry is depicted in FIG. 5E. The sidewall fragments become sloped as well during the erosion process, and form ridges 107 with specific slope angles. In some embodiments, ridge 107 is completely separate from island 102 by a gap, as shown in FIG. 5F.

After the island erosion operation, lateral epitaxial overgrowth (LEO) of cap 104 from the top plane of island 102 begins after introduction of III-N precursors into the controlled atmosphere. A second temperature is chosen to initiate the epitaxial growth. In some embodiments, temperatures for LEO growth of cap 104 are greater than 1000° C. During lateral growth, cap 104 are cantilevered from tops of island 102, and extend over the gaps separating ridge 107 from cap 104, overhanging sidewalls 103. In some embodiments, cap 104 span the gaps completely, and extend over second dielectric 109. In some embodiments, the bottom surface of cap 104 is planar with second dielectric 109, as shown in FIG. 5F. Growth of cap 104 may be terminated at any point to arrive at predetermined dimensions.

The LEO process favors lateral growth over vertical growth, and can produce high-aspect ratio structures similar to thin films. The LEO process can grow any of the materials described above to any of the thicknesses described above. As described above, cap 104 can have a thickness t1 ranging between 1 to 50 nm. The width w1 of cap 104 width ranges between 1 to 20 microns. In some embodiments, cap 104 extends along the entire length of island 102, and has a length that ranges between 1 and 100 microns, according to some embodiments. In other embodiments, the length of cap 104 ranges from 1 to 1000 microns. Cap 104 is a robust structure having high mechanical strength, and forms a contiguous structure with island 102. After cap 104 is formed, it is further processed for fabrication of electronic devices with other III-N materials. A first example is the fabrication of transistors, such as those shown in FIG. 1A.

Figure 5G:
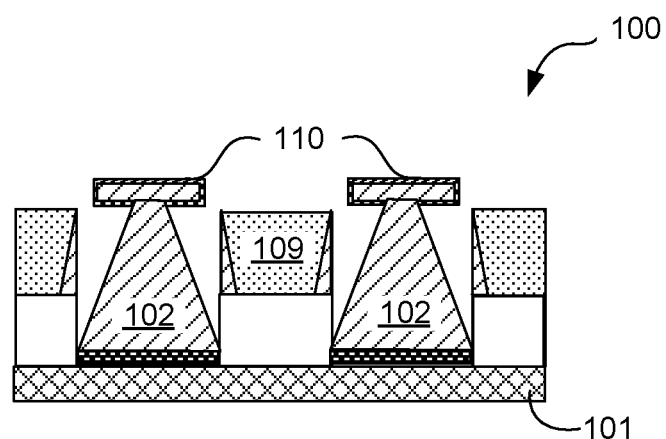

In FIG. 5G, polarization layer 110 is deposited over the exposed surfaces of cap 104. Polarization layer 110 comprises a III-N material, forms a heterolayer with cap 104. Suitable materials for formation of polarization layer 110 include, but are not limited to, AlN, AlInN, and AlGaN. These materials may be deposited by MOCVD, most effective for covering all exposed surfaces of cap 104. Other suitable techniques may be employed as well. The III-N material in polarization layer 110 forms a polar layer in the direction of the c-axis, due to asymmetry of the III-N wurtzite unit cell. As a result of the polarity of polarization layer 110, a 2DEG is induced under the top and bottom surfaces of cap 104 by attraction of electrons to the surface of cap 104. Polarization layer may extend over the length of cap 104, or can be patterned to cover portions of cap 104, according to embodiments.

Figure 5H:
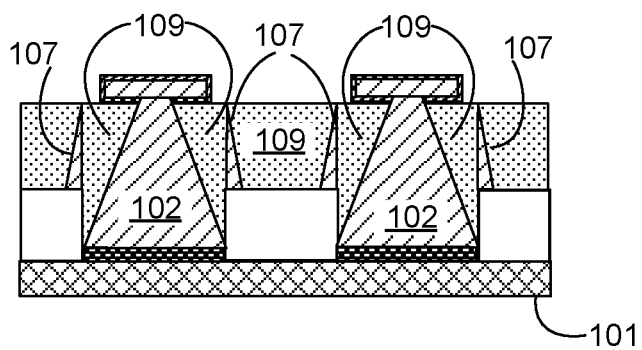

In FIG. 5H, gaps between island 102 and ridge 107 may be backfilled by deposition of a dielectric material. The backfill dielectric may comprise a material including, but not limited to, stoichiometric and non-stoichiometric compositions of silicon nitride, silicon oxynitride, silicon dioxide, carbon-doped oxide, or other low-k dielectrics having a relative permittivity of 3.5, methods for performing this operation have been described above. In some embodiments, the backfill dielectric is the same as second dielectric 109. In some embodiments, gaps between island 102 and ridge 107 are backfilled to planarize the area adjacent to cap 104. Addition of a backfill dielectric underneath cap 104 is advantageous for the operations below, where photoresist is deposited and patterned to provide a mask for gate stack formation. Details of photoresist deposition and mask patterning are not shown for simplicity.

Figure 5I:
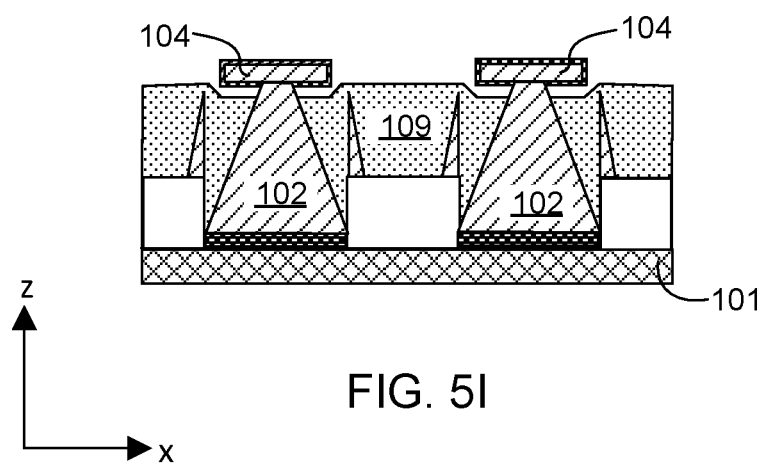
Figure 5J:
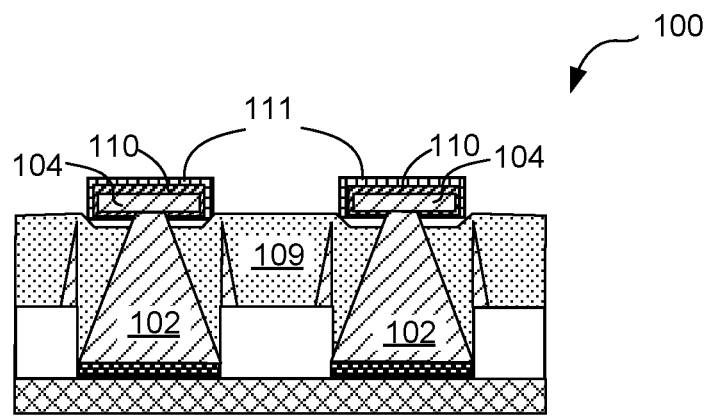

In FIG. 5I, a region of cap 104 is released from underlying dielectric by through-mask etching the dielectric. Portions of dielectric that are adjacent to source and drain regions of cap 104 have been masked so only portions of dielectric that are adjacent to gate regions of cap 104 are exposed to the etch process in order to open the bottom area of cap 104 to allow a wrap-around deposition of gate dielectric 111, where the bottom surface is covered by gate dielectric 111. In some embodiments, multiple gate regions along the length of cap 104 are released in preparation for deposition of gate dielectric 111. FIG. 5J shows gate dielectric 111 covering polarization layer 110. Gate dielectric wraps around edges of cap 104 in the released portions to at least partially cover the bottom surface of cap 104. Gate dielectric comprises materials such as, any suitable dielectric as described above but not limited to, aluminum oxide ($Al_2O_3$), hafnium dioxide ($HfO_2$), zirconium dioxide ($ZrO_2$) and titanium dioxide ($TiO_2$), or any suitable dielectric material having a permittivity $\kappa > 9$. Methods to produce gate dielectric 111 include, but are not limited to, chemical vapor deposition techniques such as atomic layer deposition (ALD), MOCVD, low pressure chemical vapor deposition (LPCVD) and plasma enhanced chemical vapor deposition (PECVD), physical deposition techniques such as RF sputtering and liquid phase deposition techniques.

Figure 5K:
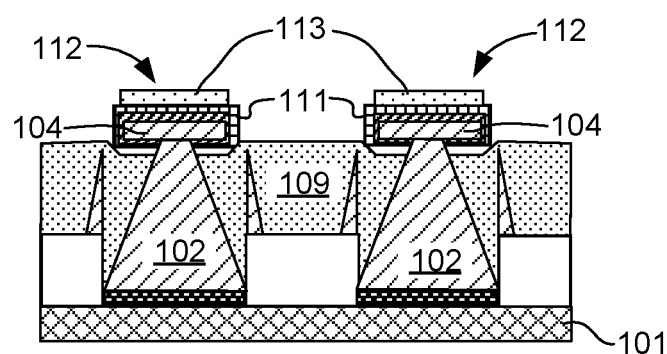

In FIG. 5K, formation of gate stack 112 is complete with deposition of gate terminal 113 over the top of gate dielectric 111. Gate terminal 113 may comprise, but not limited to, copper and alloys of copper, aluminum and alloys of aluminum, nickel, tungsten, polysilicon, etc. Materials for gate terminal 113 may be deposited by through-mask deposition by evaporation, DC or RF sputtering, or chemical vapor deposition techniques such as ALD, LPCVD, MOCVD. Gate terminal 113 covers all of the gate dielectric 111 in some embodiments, and in other embodiments, gate terminal 113 partially covers gate dielectric 111.

Although not shown in the cross-sectional views, source and drain terminals, such as source terminal 115 and drain terminal 116 as seen in FIG. 1B, may also be formed simultaneously with gate terminal 113 over regions adjacent to gate stack 112 in a though-mask deposition or metallization operation. Interconnects with interconnect routing, as shown in FIG. 3, can also be made simultaneously in the same operation or in a subsequent metallization operation.

Figure 6A:
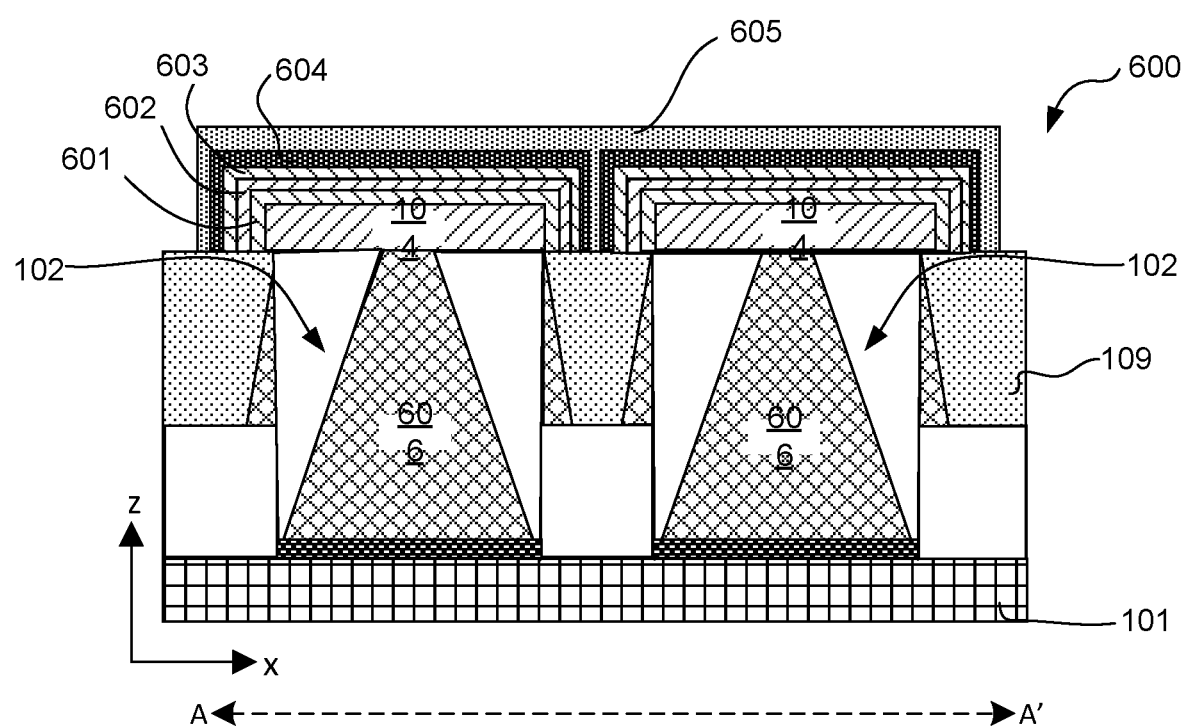
FIG. 6A illustrates a cross-sectional view in the x-z plane of a III-N LED structures in the x-z plane, in accordance with some embodiments of the disclosure.
Figure 6B:
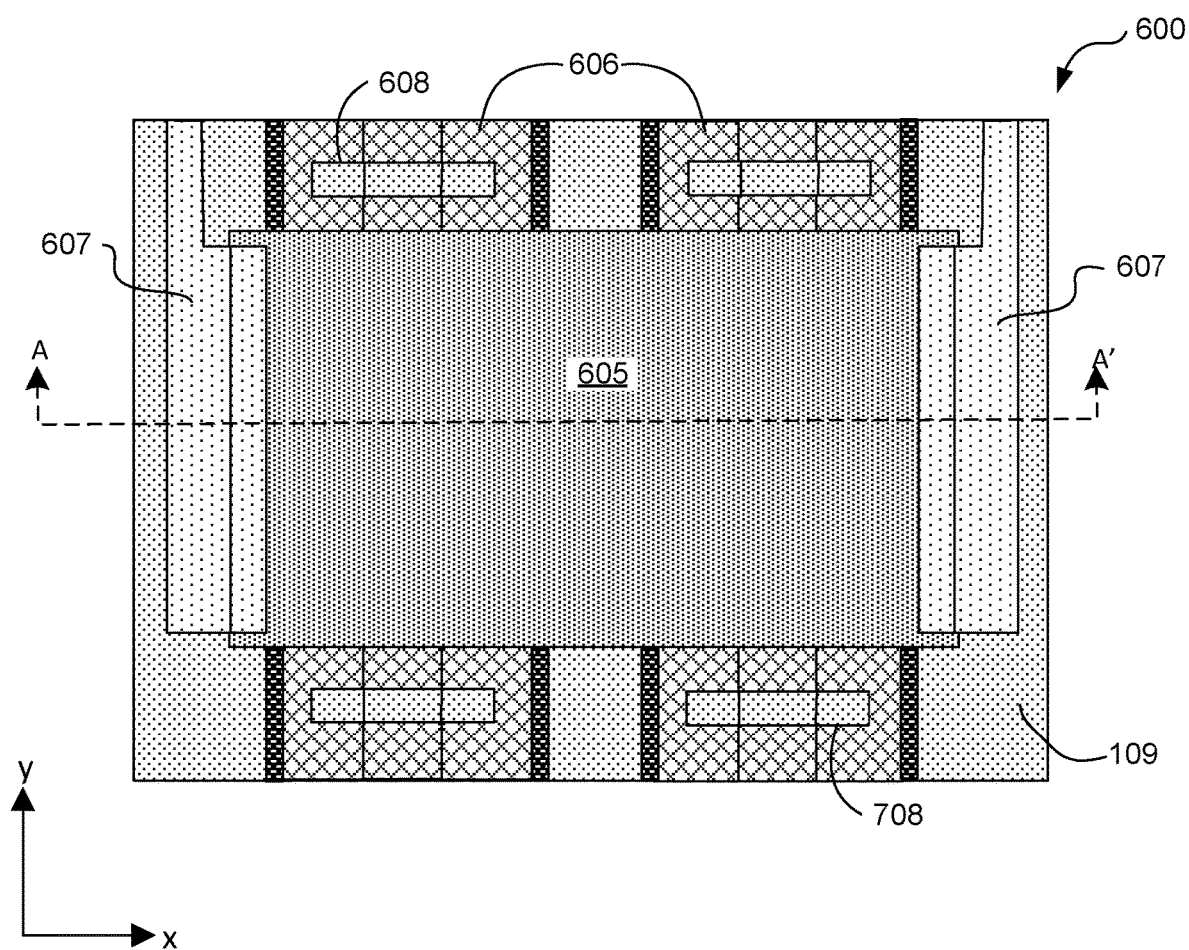
FIG. 6B illustrates a plan view in the x-y plane of the III-N LED structure, in accordance with some embodiments of the disclosure.

Optoelectronic devices may also be fabricated on caps 104. FIGS. 6A and 6B illustrate an example of a LED 600 comprising a quantum well structure, where the quantum well structure comprises cap 104 and one or more III-N heterolayers. In the cross-sectional view illustrated in FIG. 6A, alternating heterolayers of III-N materials are shown on cap 104. First heterolayer 601 overlays cap 104, and comprises a III-N material having a smaller bandgap than the III-N material in cap 104. Suitable III-N materials include, but are not limited to, InN, and alloys of InN, such as InAlN, and InGaN. The group III ratio (e.g., In:Ga) in the alloys is variable, and the bandgaps of the III-N alloys is tunable by varying the group III composition. In some embodiments, first heterolayer comprises $In_xGa_{(1-x)}N$, where x varies from 0.05 to 0.4. InGaN alloys have a tunable bandgap that may range from 0.7 eV to 1.4 eV. Second heterolayer 602 overlays first heterolayer 601. In some embodiments, second heterolayer 602 comprises a III-N material that has a larger bandgap than first heterolayer 601. In some embodiments, second heterolayer 602 comprises the same III-N material as that comprised by cap 104. In some embodiments, cap 104 and second heterolayer 602 comprise GaN. In some embodiments, LED 600 comprises a single quantum well comprising cap 104, first heterolayer 601 and second heterolayer 602. In other embodiments, LED 600 comprises a multi-quantum well structure, where additional heterolayers are included.

Referring again to FIG. 6A, third heterolayer 603 overlays second heterolayer 602. In some embodiments, third heterolayer 603 comprises a III-N material having a bandgap smaller than that of heterolayer 602. In some embodiments, third heterolayer 603 comprises the same material as comprised by first heterolayer 601. In other embodiments, third heterolayer 603 comprises a different III-N material than that comprised by first heterolayer 601. Overlaying third heterolayer 603 is fourth heterolayer 604. In some embodiments, fourth heterolayer 604 is the final heterolayer of the multi-quantum structure. As such, fourth heterolayer 604 comprises a III-N material the same as heterolayer 602 and as cap 104. In some embodiments, fourth heterolayer is doped with impurity atoms to facilitate carrier injection into the multi-quantum well structure. In some embodiments, the composition of fourth heterolayer 604 comprises magnesium or another group II element, and is a p-type semiconducting layer. As such, fourth heterolayer 604 injects holes into the multi-quantum well structure. In other embodiments, fourth heterolayer 604 comprises silicon or another group IV element, and is n-type. A first device terminal for LED structure 600 comprises transparent conductive layer 605, which overlays fourth heterolayer 604, and provides a transparent electrode for electronic and optical transfer, permitting the exit of light generated by LED structure 600. The junction at the interface between transparent conductive layer 605 and fourth heterolayer 604 may be ohmic, for example, facilitating carrier injection. In some embodiments, transparent conductive layer 605 comprises indium tin oxide (ITO). Alternative optically transparent conductive materials may also be employed, such as, but not limited to, aluminum-doped zinc oxide, gallium-doped zinc oxide, indium-doped zinc oxide, indium-doped cadmium oxide, carbon nanotubes, graphene, conductive polymers such as polyaniline, etc.

Island 102 provides a second device terminal for LED structure 600. Island 102 comprises one or more conductive region 606 of III-N material doped with silicon or another group IV element, rendering the conductive region 606 n-type, according to some embodiments. Conductive region 606 is structurally the same as island 102, and therefore structurally contiguous with cap 104. Conductive region 606 thus provides an electron injection source for LED structure 600. The III-N materials of heterolayers 601-603 and cap 104 may be chosen for emission of light in the blue to ultraviolet region of the spectrum.

FIG. 6B illustrates a plan view of LED structure 600, showing interconnect routing 607 extending over second dielectric 109 and overlaying the edges of transparent conductive layer 604. In some embodiments, interconnect routing 607 is overlaid on more than one edge of transparent conductive layer 605 as shown in FIG. 6B for more favorable current distribution. In some embodiments, transparent conductive layer 605 is substantially planar with interconnect routing 607, and in other embodiments, interconnect routing 607 is stepped at the edge of transparent conductive layer 605, as indicated by the solid lines aligned with edges. Interconnect routing 607 may be connected to the positive rail of a power source, providing forward bias to p-type layer 604 (FIG. 6A).

As, also shown in FIG. 6B, interconnect routing 608 is overlaid on conductive regions 606 of islands 102. In the plan view of FIG. 6B, conducive region 606 extends below the plane of the figure to the bottom of the trench, and solid lines inside interconnect routing 608 indicate edges and abrupt changes slope as interconnect routing is conformal to the vertical geometry of conductive regions 606 and trench walls. Interconnect routing 608 may be connected to the negative rail of a power source to provide forward bias to n-type conductive region 606.

Figure 7A:
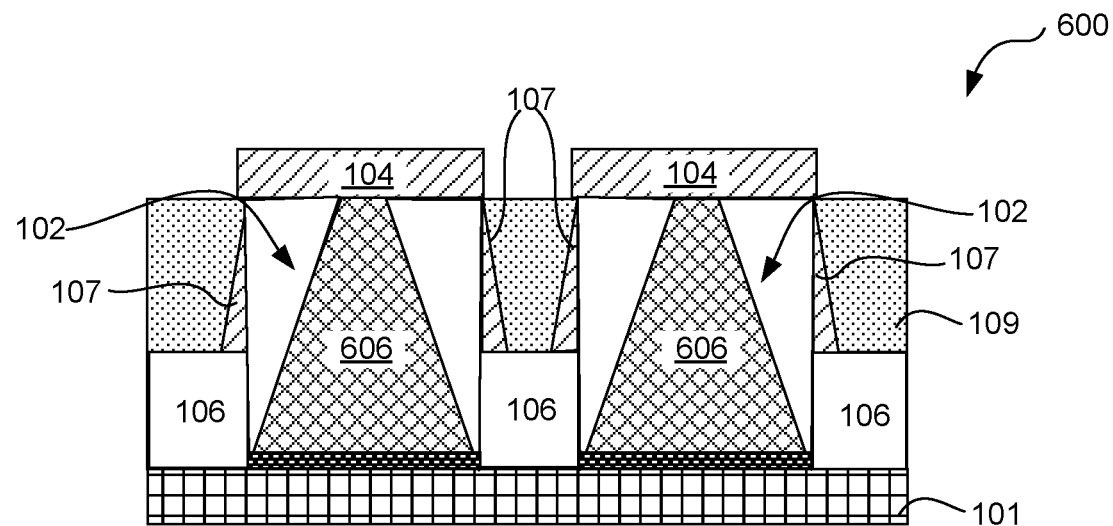
FIG. 7A-F illustrate a sequence of cross-sectional views of the evolution of a III-N LED structures during an exemplary fabrication process, in accordance with some embodiments of the disclosure.
Figure 7B:
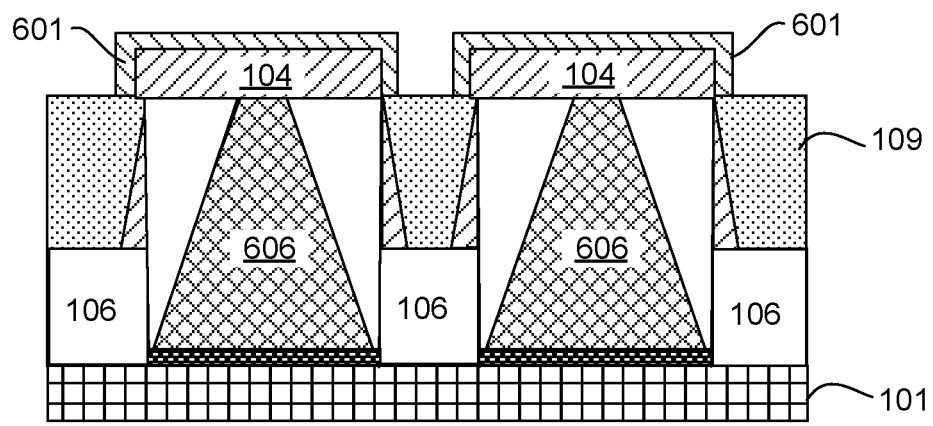
Figure 7B:
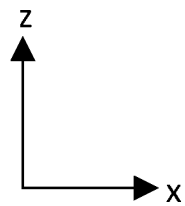

FIG. 7A-F depict an exemplary process for fabrication of III-N LEDs having one or more features of embodiments described for FIGS. 6A and 6B, and arriving at LED structure 600. In FIG. 7A, the process begins with receiving a substrate 101 having cap 104 epitaxially grown over island 102, as described for the exemplary method for fabricating transistor structure 100, and depicted in FIGS. 5A-5F. In the illustrated embodiment, island 102 comprises conductive region 606 under cap 104. As shown in FIG. 7B, conductive region 606 extends along the length of island 102 beyond the edges of cap 104. Materials comprised by conductive region 606 have been described above. In some embodiments, conductive region 606 extends over the entire length of island 102, while in other embodiments, conductive region 606 alternates with resistive regions along the length of island 102. In the illustrated embodiment, cap 104 is shown to extend over ridge 107 on both sides of island 102, however cap 104 may partially span the distance between top of island 102 and ridge 107. The x-dimension of LED structure 600 is mostly determined by the width of cap 104.

In FIG. 7B, first heterolayer 601 is deposited over cap 104. In some embodiments, first heterolayer 601 is an epitaxial film grown on cap 104, forming a first heterojunction in a quantum well structure. Materials comprised by first heterolayer 601 have been described above, and in some embodiments, comprise monocrystalline mixtures of InN and GaN having the formula $In_xGa_{(1-x)}N$, where x is a fraction ranging from 0 to 1. In some embodiments, InN may comprise 5% to 40% of the mixture, where the bandgap of the mixture is smaller than that of cap 104. First heterolayer 601 may be deposited by several suitable high vacuum or atmospheric pressure methods for epitaxial film growth, which include, but not limited to, chemical vapor deposition methods such as MOCVD, LPCVD, APCVD, PECVD. In some embodiments, atomic layer deposition (ALD) is employed to deposit a monocrystalline film of first heterolayer 601. Liquid phase deposition methods are possible, such as LPCVD. In some embodiments, first heterolayer 601 is grown to a thickness that ranges from 10 nm to 100 nm.

Figure 7C:
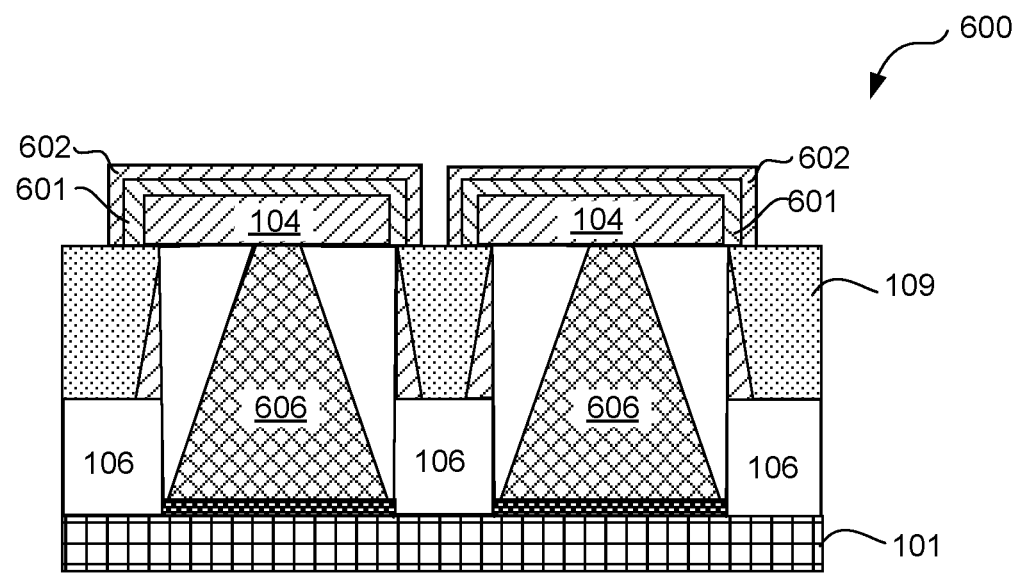
Figure 7D:
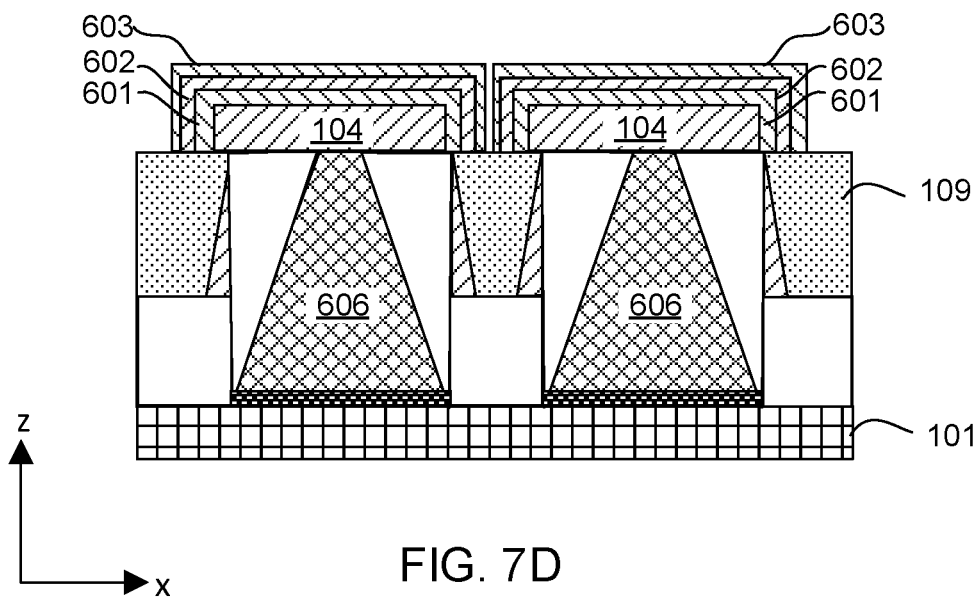

In FIG. 7C, second heterolayer 602 is deposited over first heterolayer 601, forming a second heterojunction. In some embodiments, second heterolayer 602 is an epitaxial layer. Techniques employed to grow second heterolayer 602 are the same or similar to those employed to grow first heterolayer 601. In some embodiments, second heterolayer 602 is grown epitaxially on first heterolayer 601. In some embodiments, second heterolayer 602 comprises a III-N material having substantially the same composition as that of cap 104. The bandgap of second heterolayer 602 is the same as that of cap 104. In other embodiments, second heterolayer 602 comprises a III-N material having a composition different from that of cap 104, such as a material comprising InGaN mixtures or InAlN mixtures. Depending of the composition, the bandgap of second heterolayer 602 may be larger or smaller than the bandgap of cap 104. As an example, inclusion of AlN (bandgap ~6 eV) with GaN (bandgap ~3.4 eV) in an AlGaN mixture results in a material having a larger bandgap than pure GaN in cap 104. Smaller bandgaps for second heterolayer 602 result by epitaxially growing a layer comprising mixtures of InN with GaN. In some embodiments, the bandgap of second heterolayer 602 is larger than the bandgap of first heterolayer 601, forming first quantum well comprising second heterolayer 602, first heterolayer 601 and cap 104. In some embodiments, the first quantum well terminates the quantum well structure with heterolayer 602. In embodiments of LED structure having a single quantum well, second heterolayer 602 is a semiconducting layer that comprises impurity atoms, such as silicon or magnesium, to dope the material n-type or p-type, respectively.

In other embodiments, LED 600 comprises a multi-quantum well structure. Continuing with the exemplary process in FIG. 7D, third heterolayer 603 is grown over second heterolayer 602. In some embodiments, third heterolayer 603 comprises substantially the same III-N material as first heterolayer 601, and has a bandgap that is substantially the same as the bandgap of first heterolayer 601. Alternating quantum well layers having substantially equal bandgaps results in the formation of a uniform quantum well structure, where quantum wells have the same depth. In other embodiments, third heterolayer 603 comprises a III-N material having a composition differing from that of first heterolayer 601, therefore having a bandgap different than that of first heterolayer 601. As an example, first heterolayer 601 comprises a III-N material having the formula $In_xGa_{(1-x)}N$ resulting in a first bandgap, and third heterolayer 603 comprises a III-N material having the composition $In_yGa_{(1-y)}N$ resulting in a second bandgap, where x and y are fractions ranging between 0 and 1, and x≠y. Alternating quantum well layers having progressively increasing or decreasing bandgaps results in the formation of a step-graded quantum well structure.

Figure 7E:
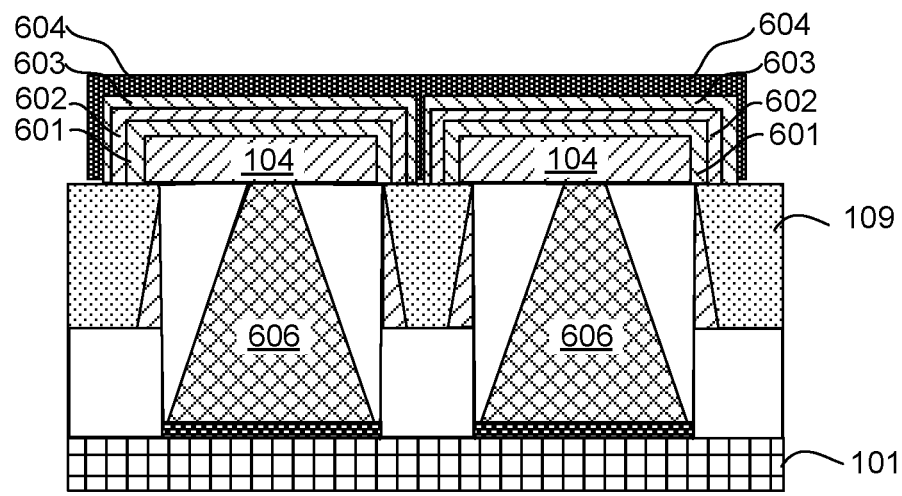

In FIG. 7E, fourth heterolayer 604 is grown over third heterolayer 603. According to embodiments, fourth heterolayer 604 comprises a material that has a bandgap larger than that of third heterolayer 603, forming a second quantum well with third heterolayer 603 and second heterolayer 602. In the illustrated embodiment, fourth heterolayer 604 comprises a doped III-N material, in contrast to cap 104, first heterolayer 601, second heterolayer 602, and third heterolayer 603, which are intrinsic semiconductors in some embodiments. Fourth heterolayer 604 terminates the multi-quantum well structure, which comprises two quantum wells in the illustrated embodiment. In other embodiments of the exemplary method, growth of alternate heterolayers continues beyond fourth heterolayer 604 to produce additional quantum wells, and the multi-quantum well structure comprises three or more quantum wells.

Referring again to FIG. 7E, fourth heterolayer 604 is a doped layer, and comprises impurity atoms that are implanted into heterolayer 604 after growth of the layer, according to some embodiments. In other embodiments, impurity atoms are incorporated into the growing layer by inclusion of impurity precursors a growth chamber, e.g., for MOCVD and related techniques. In some embodiments, the impurity atoms are magnesium or another group II element. to render fourth heterolayer 604 p-type. In other embodiments, fourth heterolayer 604 comprises silicon or another group IV element to render fourth heterolayer 604 n-type.

In some embodiments, fourth heterolayer 604 forms the p-type region of LED structure 600. Fourth heterolayer 604 also electrically bridges the multi-quantum well structure to a metallic contact for biasing LED structure 600. Under forward bias, fourth heterolayer provides hole injection into the multi-quantum well structure. The injected holes recombine with electrons injected into the one or more quantum well from n-type conductive regions 606 underneath cap 104. Light resulting from carrier recombination within the quantum well structure has a wavelength corresponding to the size of the bandgap (or bandgaps if step-graded) of the one or more quantum well.

Figure 7F:
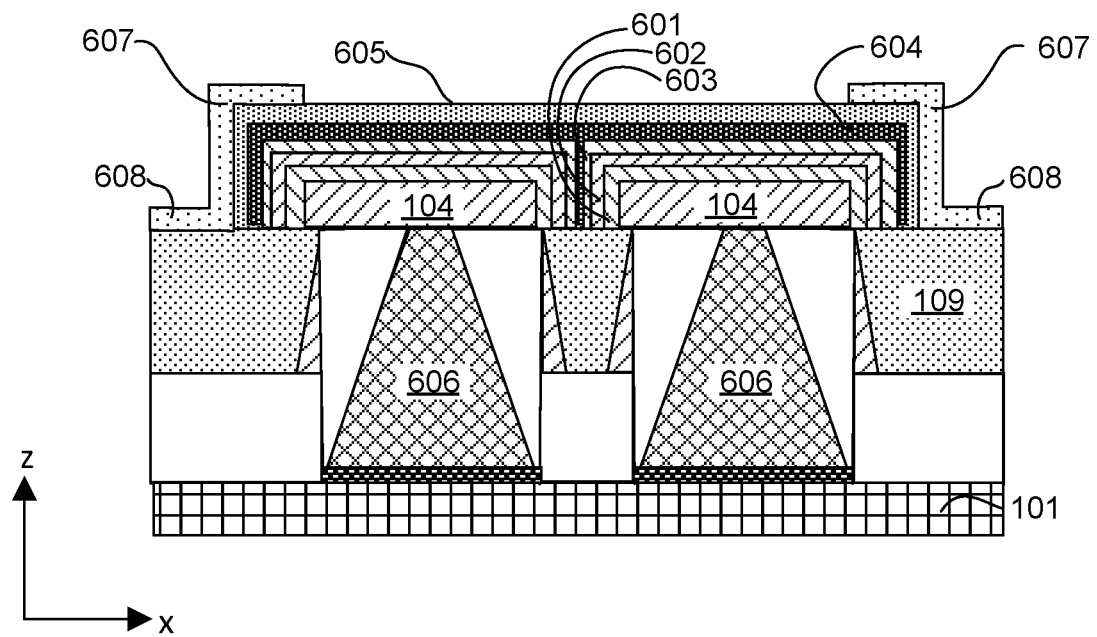

In FIG. 7F, transparent conductive layer 605 is deposited over fourth heterolayer 604. In some embodiments, transparent conductive layer 605 comprises an optically transparent metallic material, such as, but not limited to, indium tin oxide (ITO). Alternative materials may also be employed, and are listed in the description above. Optical transparency is necessary for light emission. As an example, ITO is transparent in the visible and UV spectral region from above 700 nm to approximately 320 nm. ITO is a polycrystalline material, and may be deposited by physical deposition methods such as, but not limited to, evaporation and DC or RF sputtering.

In some embodiments, transparent conductive layer 605 forms an ohmic contact with fourth heterolayer 604, facilitating hole current flow under forward bias. In the illustrated embodiment, transparent conductive layer 605 is formed over more than one adjacent cap 104, spanning two or more widths of cap 104. In other embodiments, transparent conductive layer 605 is confined to form on a single width of cap 104, where transparent layers formed over LEDs on a single cap 104 are separate from those formed on an adjacent cap 104. Also shown in FIG. 7F is first metal contact 607. In some embodiments, metal contact 607 is a conformal metal layer comprising metals as described above. First metal contact 607 may be formed by a in a through-mask deposition process that includes, but is limited to, evaporation, DC and RF sputtering, electroplating, MOCVD, LPCVD, and ALD. In the illustrated embodiment, metal contact 607 has been deposited at the edges of transparent conductive layer 605. Interconnect 608 is routed over second dielectric layer 109, and is contiguous with first metal contact 607, according to some embodiments.

In some embodiments, multiple units of LED structure 600 are formed on caps that are continuous ribbon-like structures. In other embodiments, ribbon-like caps have been subdivided by an etch process, leaving isolated segments of the caps along the length of a supporting island. Individual units of LED structure 600 are be formed on the isolated cap segments. The isolated segments of cap 104 may repeat over the length of a continuous island, having a length many times greater than its width. In other embodiments, isolated segments of cap 104 are supported on short islands, whose length is on the same order as its width, repeated in arrays extending in both the x-dimension and y-dimension.

Figure 8:
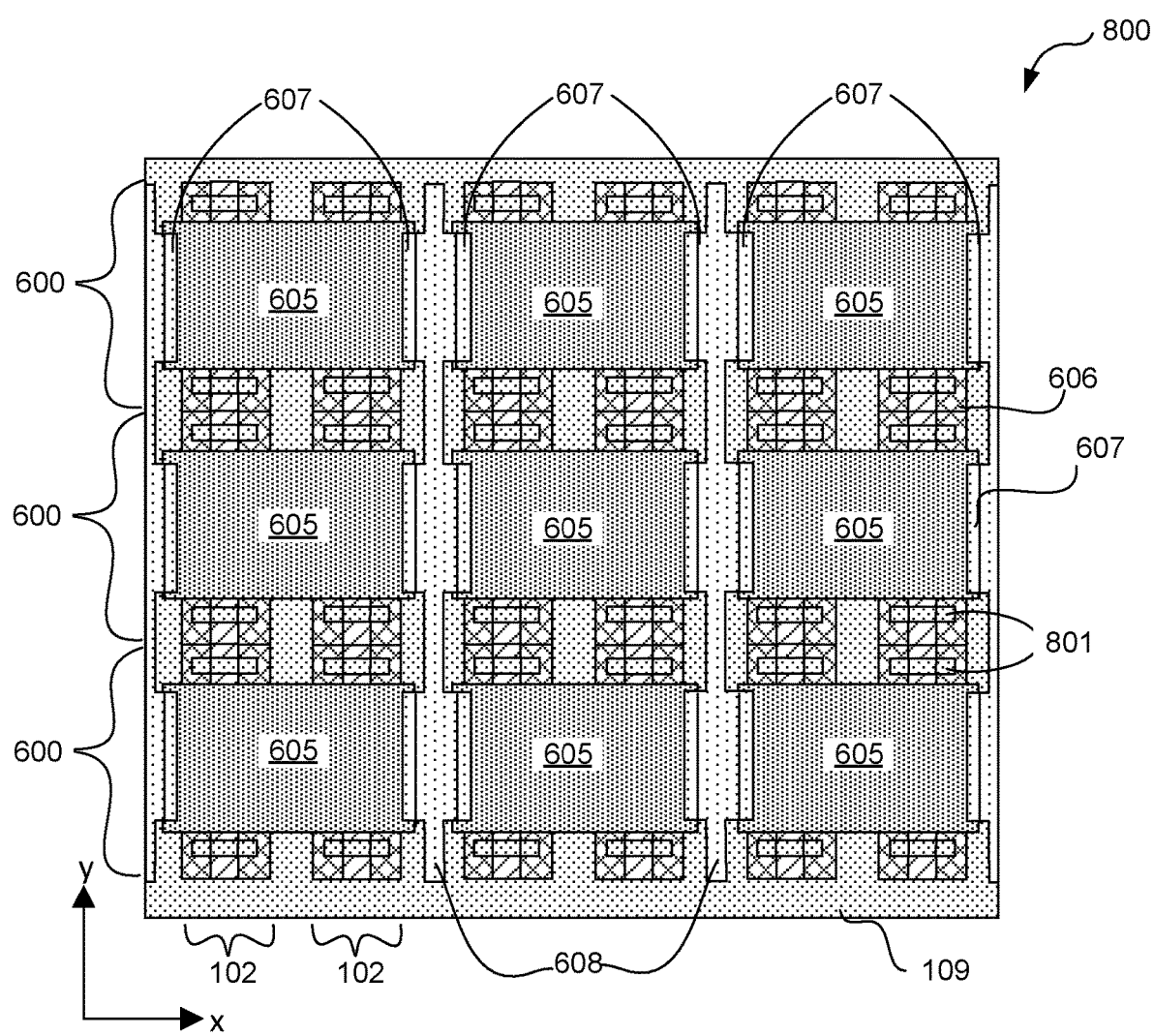
FIG. 8 illustrates a plan vie in the x-y plane of an array of III-N LED structures, in accordance with some embodiments of the disclosure.

FIG. 8 illustrates a plan view of LED matrix 800, comprising multiple copies of LED structure 600 as shown in FIG. 6B, arranged in an array extending in the x and y dimensions. In some embodiments, transparent conductive layer 605 forms a transparent electrode that is contacted on both lateral edges by first metal contact 607. In some embodiments, metal contact 607 is formed as a contiguous structure with interconnect 608, deposited as a power bus along second dielectric layer 109 between rows of LED structure 600 to provide bias. In some embodiments, conductive region 606 on the underside of LED structure 600 provides a backside contact to LED structure 600, as described above. In the illustrated embodiment, both terminals for LED structure 600 may be accessible from the same side. Conductive regions 606 of island 104 are exposed between repeating units of LED structure 600. Conformal strips of second metal contract 801 overlay conductive regions 606 in the exposed areas, providing front side contacts to the underside terminal of LED structure 600.

Other two-terminal devices may be formed on cap 104. One such example is a piezoelectric resonator. Due to the polar nature of wurtzite crystal structure, III-N materials display piezoelectric behavior to varying degrees. Aluminum nitride (AlN) exhibits a strong piezoelectric tendency of the III-N materials (e.g., $d_{33}$~5 pm/V for AlN vs. $d_{33}$~3 pm/V for GaN). AlN caps can be grown epitaxially on islands comprising other materials such as GaN, and may be employed as a piezoelectric resonator structure.

Figure 9A:
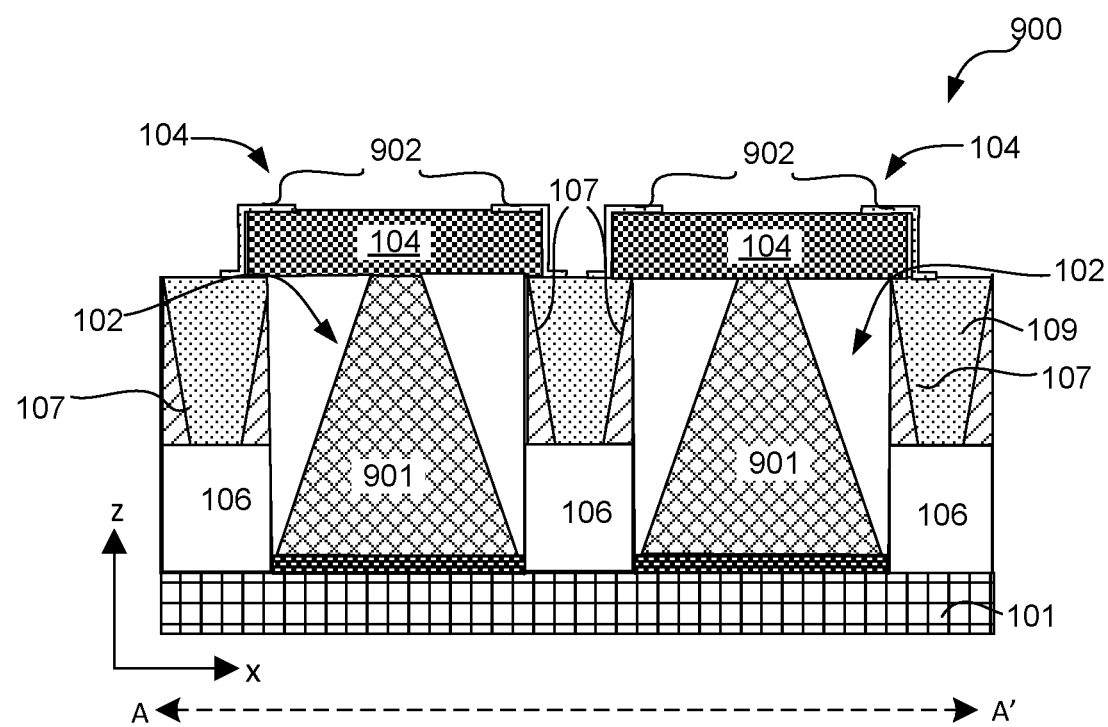
FIG. 9A illustrates a cross-sectional view in the x-z plane of III-N piezoelectric structures, in accordance with some embodiments of the disclosure.

FIG. 9A illustrates a cross-sectional view of piezoelectric resonator structure 900, comprising cap 104 extending from the top of island 102. Both cap 104 and island 102 comprise a III-N material, as in the earlier examples (e.g., transistor structure 100 and LED structure 600). In embodiments of piezoelectric resonator structure 900, cap 104 is a resonating membrane structure. In some embodiments, cap 104 comprises AlN, GaN, InN, or alloys of AlN, GaN and InN. In some embodiments, island 102 comprises III-N materials that is a different material than that of cap 104. In some embodiments, island 102 comprises sections of conductive region 901 providing underside contacts to cap 104. Conductive region 901 comprises a III-N material doped with an impurity element, such as silicon or another group IV element, as described similarly for conductive region 119 of transistor structure 100 and conductive region 606 of LED structure 600. In some embodiments, conductive region 901 comprises a n-type III-N semiconductor, such as, but not limited to, n-type GaN, or alloys of GaN, InN and AlN. In some embodiments, conductive region 901 provides a first terminal to cap 104 from under cap 104. The resonant frequency of cap 104 is a function of its thickness. As an example, at a thickness of 1 micron, the resonant frequency of cap 104 is 10 GHz. In some embodiments, cap 104 has a thickness ranging from less than 1 micron to several microns.

Electrical contacts to cap 104 may be made in a variety of ways. In the illustrated embodiment of FIGS. 9A and 9B, a second terminal is provided by edge contacts 902 extending along the edges of cap 104. In the illustrated embodiment, terminals are disposed at the midline of cap 104 from underneath by conductive region 901, and along parallel edges of cap 104 by way of edge contacts 902. Other arrangements are possible for making electrical contacts to resonator membrane 901.

Figure 9B:
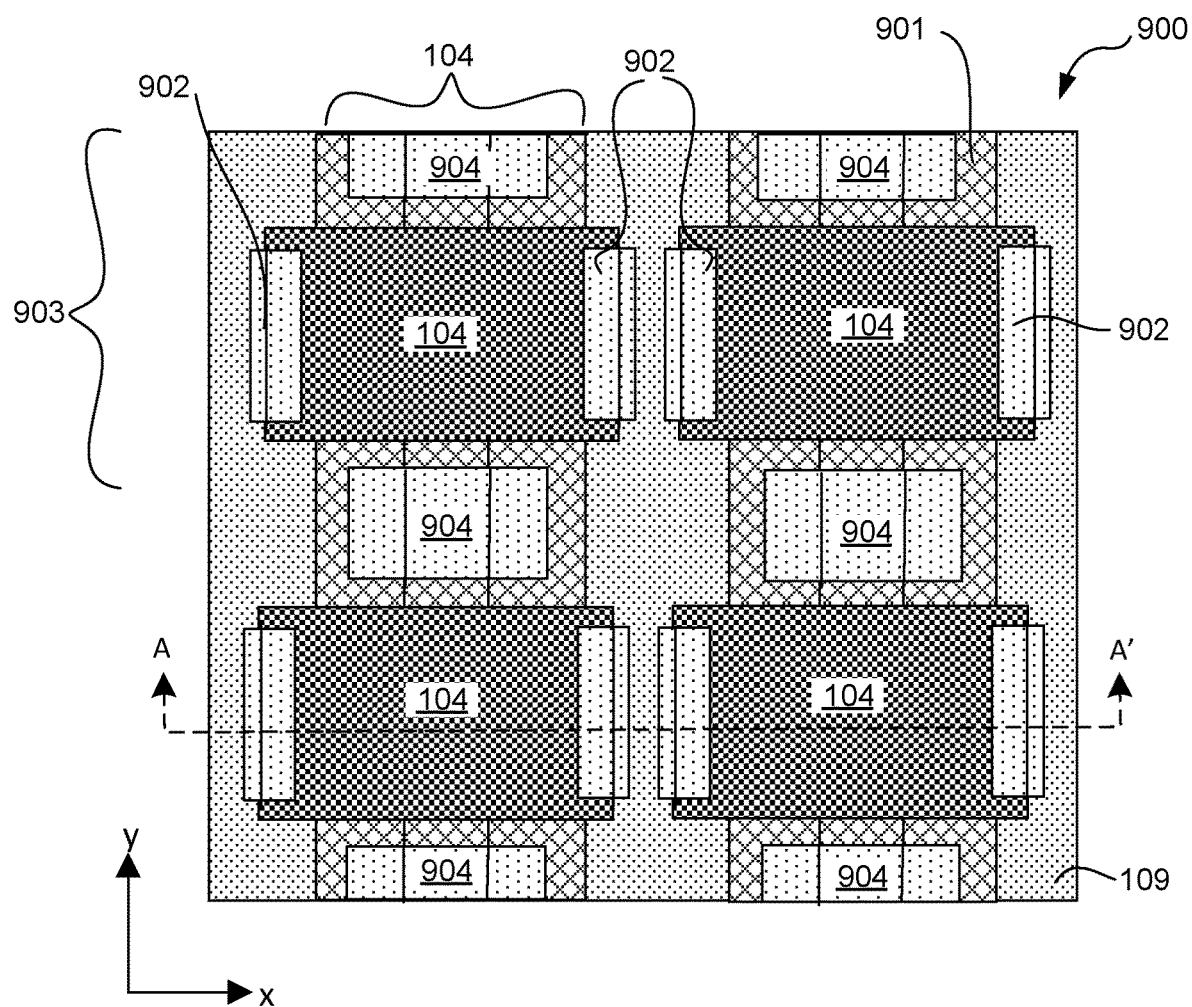
FIG. 9B illustrates a plan view in the x-y plane of the III-N structure with multiple piezoelectric elements, in accordance with some embodiments of the disclosure.

FIG. 9B illustrates a plan view of piezoelectric resonator 900. Cap 104 is distributed at intervals to provide an array of separate resonating structures 903 distributed along island 102. Between resonator structures 901 are pads 904 over conductive region 901. Pads 904 provide ohmic contacts to conductive region 901, and comprise metals such as, but not limited to, titanium, aluminum, tungsten and molybdenum. Piezoelectric resonator structure 900 may be employed as III-N high-frequency crystal oscillators and clocks in both digital and analog integrated circuits.

Figure 10A:
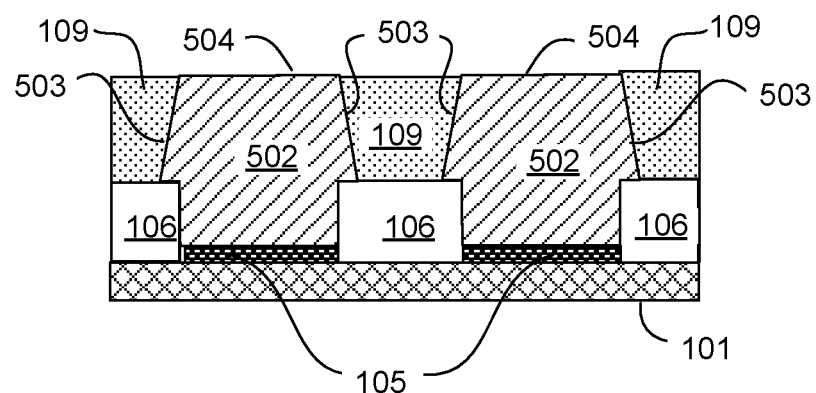
FIG. 10A-D illustrate a sequence of cross-sectional views of the evolution of a III-N piezoelectric structure during an exemplary fabrication process, in accordance with some embodiments of the disclosure.
Figure 10B:
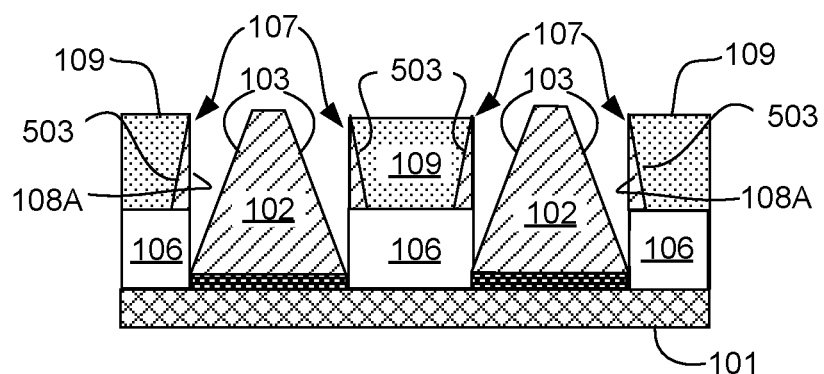

FIGS. 10A-10D illustrate an exemplary process for fabrication of III-N piezoelectric resonators having one or more features described for FIGS. 9A and 9B, and arriving at piezoelectric resonator structure 900. As a starting point, the process begins with receiving a substrate 101 having precursor island 502 epitaxially grown from trenches in first dielectric layer 106, as shown in FIG. 10A. In some embodiments, the stage of fabrication is the same as shown in FIG. 5D for transistor structure 100. Precursor island 502 is surrounded by second dielectric layer 109. In FIG. 10B, precursor island 502 has undergone erosion process by exposure to a nitrogen-lean hydrogen atmosphere at temperatures of 1000° C., forming island 102 with a peaked profile. Ridge 107 remains as a remnant of sidewall 503. In some embodiments, precursor island 502 is doped n-type by adding a precursor of silicon or another group IV element at impurity levels. In other embodiments, precursor island 502 or island 102 are doped n-type by implantation and/or diffusion doping of silicon into the structure.

Figure 10C:
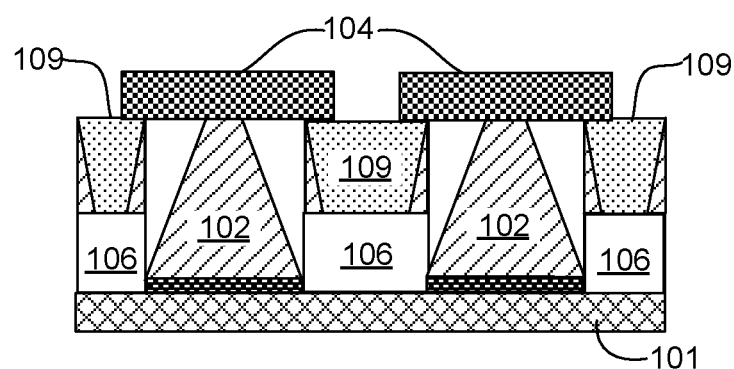

In FIG. 10C, cap 104 is grown epitaxially on top of island 102 by addition of III-N precursors in the growth chamber. The growth process for cap 104 has been described in detail above. In some embodiments, cap 104 comprises AlN. In other embodiments, cap 104 comprises an alloy of AlN and GaN. The dimensions of cap 104 determine its resonant frequency, and cap 104 is grown to a thickness of less than a micron to several microns.

Figure 10D:
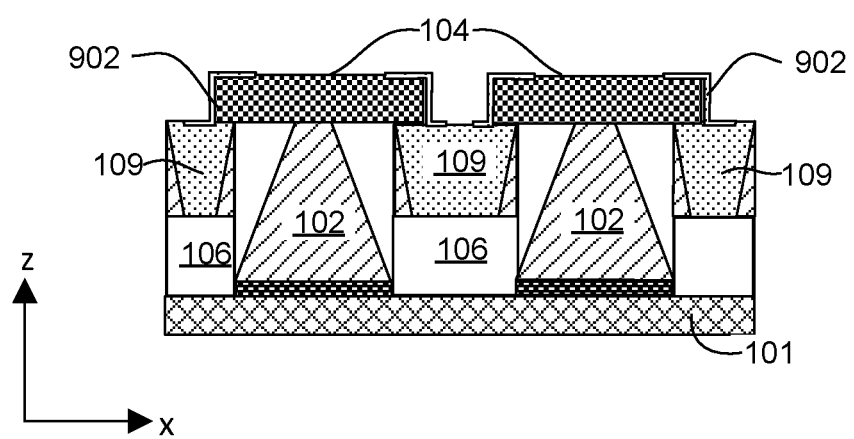

In FIG. 10D, edge contacts 903 are added. In some embodiments, edge contacts 902 are formed in a through-mask deposition of a suitable metal (e.g., Ti, W, Mo, Al) onto cap 104. In some embodiments, edge contacts 109 are conformal, and are partially deposited at the edge of cap 104, and partially on second dielectric layer adjacent to cap 104, forming a contiguous metal layer. Although not shown in the cross-sectional view of FIG. 10D, pads 904 may be deposited over island 102 at the same time.

Figure 11:
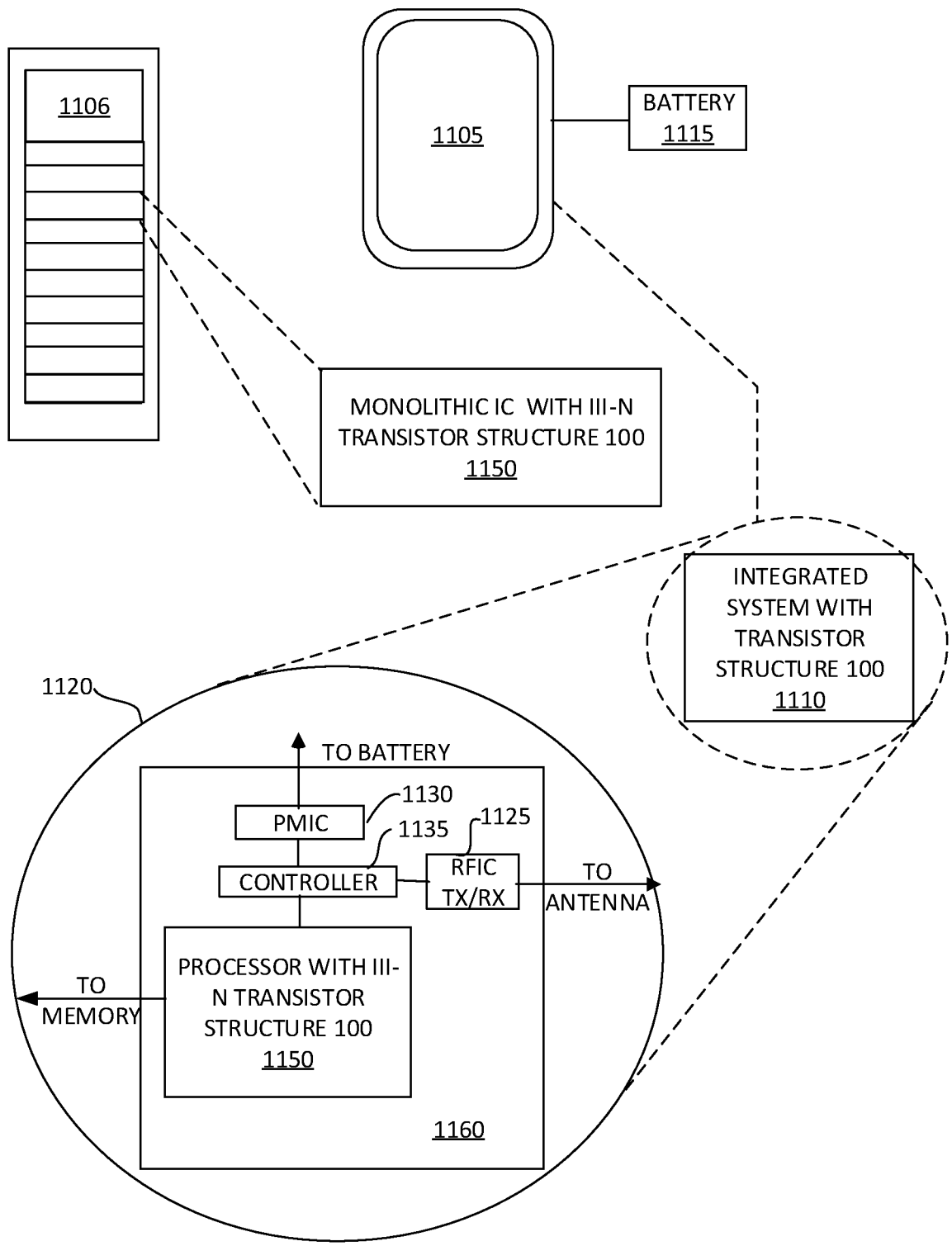
FIG. 11 illustrates a mobile computing platform and a data server machine employing a SoC that includes a III-N transistor device, in accordance with some embodiments of the disclosure.

FIG. 11 illustrates a system 1100 in which a mobile computing platform 1105 and/or a data server machine 1106 employs an IC, in accordance with some embodiments. In further embodiments, the IC includes any of the metallization structures described elsewhere herein. The server machine 1106 may be any commercial server, for example including any number of high-performance computing platforms disposed within a rack and networked together for electronic data processing, which in the exemplary embodiment includes a packaged monolithic IC 1150 comprising III-N transistor structure 100. The mobile computing platform 1105 may be any portable device configured for each of electronic data display, electronic data processing, wireless electronic data transmission, or the like. For example, the mobile computing platform 1105 may be any of a tablet, a smart phone, laptop computer, etc., and may include a display screen (e.g., a capacitive, inductive, resistive, or optical touchscreen), a chip-level or package-level integrated system 1110, and a battery 1115.

Whether disposed within the integrated system 1110 illustrated in the expanded view 1120, or as a stand-alone packaged chip within the server machine 1106, packaged monolithic IC 1150 includes a memory chip (e.g., RAM), or a processor chip (e.g., a microprocessor, a multi-core microprocessor, graphics processor, or the like) including at least one III-N transistor device, for example a device comprising transistor structure 100, as described above. The monolithic IC 1150 may be further coupled to a board, a substrate, or an interposer 1160 along with, one or more of a power management integrated circuit (PMIC) 1130, RF (wireless) integrated circuit (RFIC) 1125 including a wideband RF (wireless) transmitter and/or receiver (TX/RX) (e.g., including a digital baseband and an analog front-end module further comprises a power amplifier on a transmit path and a low noise amplifier on a receive path), and a controller thereof 1135.

Functionally, PMIC 1130 may perform battery power regulation, DC-to-DC conversion, etc., and so has an input coupled to battery 1115 and with an output providing a current supply to other functional modules. As further illustrated, in the exemplary embodiment, RFIC 1125 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single IC coupled to the package substrate of the monolithic IC 1150.

Figure 12:
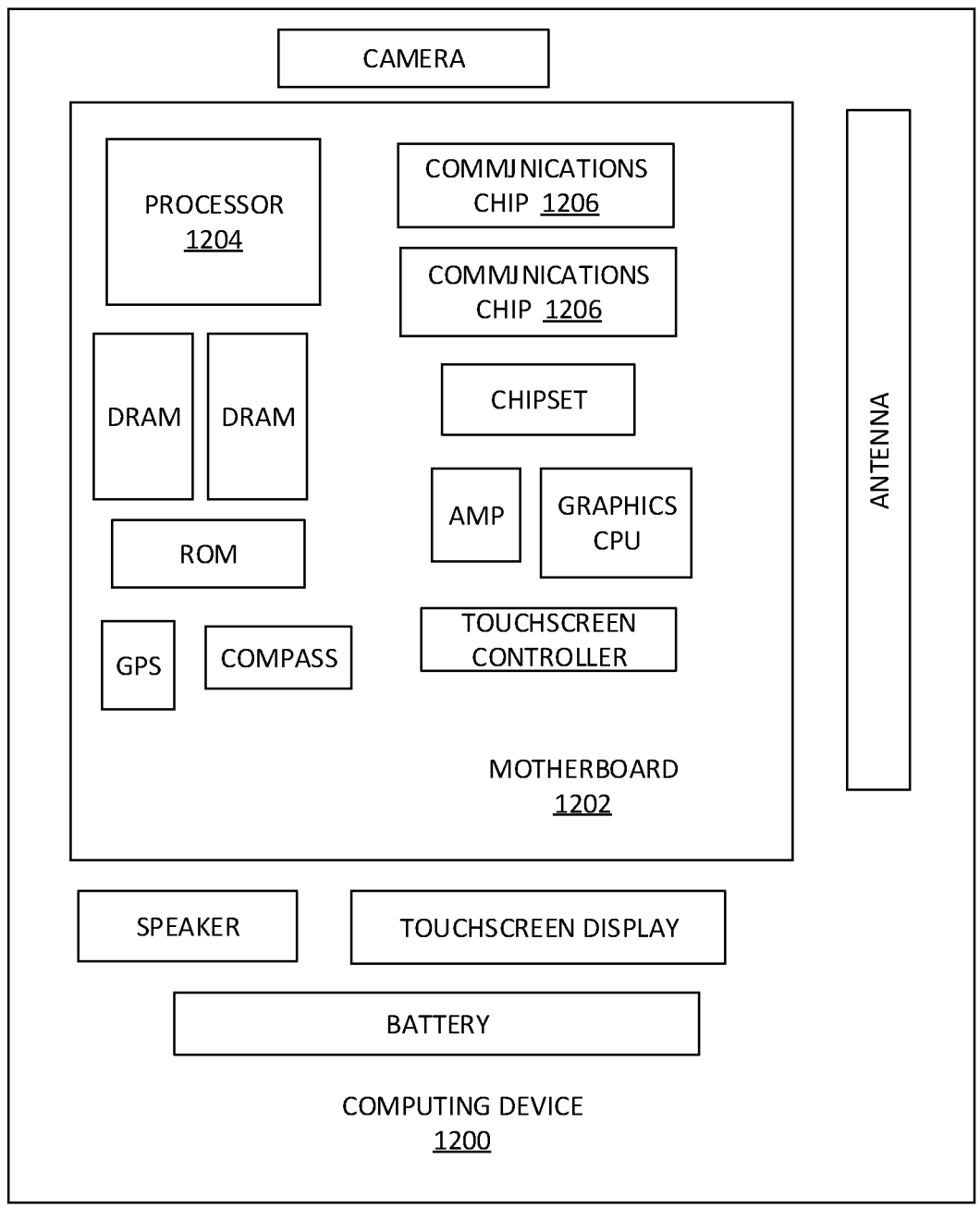
FIG. 12 is a functional block diagram of an electronic computing device including III-transistor device, in accordance with some embodiments of the disclosure.

FIG. 12 is a functional block diagram of a computing device 1200, arranged in accordance with at least some implementations of the present disclosure. Computing device 1200 may be found inside platform 1105 or server machine 1106, for example. Device 1200 further includes a motherboard 1202 hosting a number of components, such as, but not limited to, a processor 1204 (e.g., an applications processor), which may further incorporate III-N transistor device, for example a device comprising transistor structure 100, as described above. Processor 1204 may be physically and/or electrically coupled to motherboard 1202. In some examples, processor 1204 includes an integrated circuit die packaged within the processor 1204. In general, the term "processor" or "microprocessor" may refer to any device or portion of a device that processes electronic data from registers and/or memory to transform that electronic data into other electronic data that may be further stored in registers and/or memory.

In various examples, one or more communication chips 1206 may also be physically and/or electrically coupled to the motherboard 1202. In further implementations, communication chips 1206 may be part of processor 1204. Depending on its applications, computing device 1200 may include other components that may or may not be physically and electrically coupled to motherboard 1202. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1206 may implement any of a number of wireless standards or protocols, including but not limited to those described elsewhere herein. As discussed, computing device 1200 may include a plurality of communication chips 1206. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The following examples pertain to further embodiments. Specifics in the examples may be used anywhere in one or more embodiments. All optional features of the apparatus described herein may also be implemented with respect to a method or process.

Example 1 is a structure comprising an island comprising a III-N material, wherein the island extends over a substrate and has a sloped sidewall; and a cap comprising a III-N material, wherein the cap layer extends laterally from a top surface and overhangs the sidewall of the island.

Example 2 includes all the features of example 1, wherein a dielectric layer is disposed on the surface of the semiconductor and surrounds the first III-N mesa.

Example 3 includes all the features of example 1, wherein the island extends over a length of the substrate and the cap layer extends over the island along the length.

Example 4 includes all of the features of example 1, wherein the island is a first island, and the structure further comprises a second island and a third island with the first island therebetween, wherein the second and third islands extend the length over the substrate and comprise the same III-N material as the substrate.

Example 5 includes all of the features of example 4, wherein the cap extends laterally over a first separation between the first island and the second island, and extends laterally over a second separation between the first island and the third island.

Example 6 includes all of the features of example 4, further comprising a dielectric material within the first and second separations.

Example 7 includes all of the features of example 4, wherein the second and third islands have a first sidewall adjacent to the first island, and wherein the first sidewall has a steeper slope than the sidewall of the first island.

Example 8 includes all of the features of example 1, The structure of claim 1, wherein the island extends from a layer comprising a III-N material disposed on the substrate, the III-N material of the layer having a different composition than the III-N material of the island.

Example 9 includes all of the features of example 6, wherein the III-N material of the layer is one of AlN or AlGaN.

Example 10 includes all of the features of example 1, wherein both the island and cap comprise crystalline III-N material.

Example 11 includes all of the features of example 10, wherein the III-N material and the cap is one of GaN or AlN.

Example 12 is a device, comprising a structure, comprising an island comprising a III-N material, wherein the island extends over a length of a substrate and has a sloped sidewall, and a cap having a top, a bottom, a width and a length, and extends over the island along the length of the cap, and comprises a III-N material, wherein the width of the cap extends laterally from a top surface of the island and overhangs the sidewall of the island, and one or more device terminals coupled to the cap.

Example 13 includes all of the features of example 12, wherein the cap comprises a polarization layer, wherein the polarization layer extends over at least a portion of the cap and comprises a III-N material having a composition distinct from the composition of the cap.

Example 14 includes all of the features of example 13, wherein the polarization layer is one of AlN, AlGaN or InAlN.

Example 15 includes all of the features of example 13, wherein a dielectric layer extends over one or more portions of the polarization layer.

Example 16 includes all of the features of example 15, wherein the dielectric layer comprises a material having a dielectric constant greater than 3.9.

Example 17 includes all of the features of example 15, wherein the one or more device terminals include a gate electrode over at least a portion of the dielectric layer.

Example 18 includes all of the features of example 15, wherein the cap comprises a source region adjacent to a first side of the dielectric layer and a drain region adjacent to a second side of the dielectric layer, the first side opposite the second side.

Example 19 includes all of the features of example 18, wherein the one or more device terminals include a source electrode over the source region and a drain electrode over the drain region.

Example 20 includes all of the features of example 18, wherein the source region and the drain region extend from the dielectric layer along the length of the cap.

Example 21 includes all of the features of example 20, wherein the one or more device terminals are portions of the island comprising silicon coupled to the bottom of the source region and the drain region of the cap through the top of the island, the portions of the island comprising silicon distributed lengthwise along the island.

Example 22 includes all of the features of example 12, wherein a layer comprising a III-N material that has a bandgap different from the bandgap of the cap material extends over at least a portion of the cap, wherein the cap comprises a quantum well layer.

Example 23 includes all of the features of example 12, wherein the cap comprises one or more alternating layers comprising a first layer comprising a III-N material that has a bandgap sufficiency different from the bandgap of the cap material, and a second layer comprising the III-N material of the cap, and extend over at least a portion of the cap, wherein the cap comprises a quantum well layer.

Example 24 includes all of the features of examples 22 through 23, wherein the composition of the layer comprising a material that has a bandgap different from the bandgap of the cap material is a InGaN alloy.

Example 25 includes all of the features of example 24, wherein the InGaN alloy composition ranges from 5% to 40%.

Example 26 includes all of the features of examples 22 through 23, wherein a layer of a III-N material comprising magnesium extends over the quantum well layer.

Example 27 includes all of the features of example 26, wherein a transparent electrode is disposed over the layer of a III-N material comprising magnesium.

Example 28 includes all of the features of example 27, wherein the transparent electrode is one of indium tin oxide or indium gallium zinc oxide.

Example 29 includes all of the features of examples 22 through 27, wherein the one or more device terminals are regions of the island comprising silicon that couple to the cap through the top of the island.

Example 30 includes all of the features of examples 22 to 29, wherein the cap is part of a light-emitting diode structure.

Example 31 includes all of the features of example 12, wherein the cap comprises a piezoelectric material.

Example 32 includes all of the features of example 31, wherein the piezoelectric material is AlN.

Example 33 includes all of the features of example 31, wherein the one or more device terminals are regions of the island comprising silicon coupled to the cap through the top of the island.

Example 34 includes all of the features of example 31, wherein the one or more device terminals are coupled to the top and sides of the cap.

Example 35 is a method comprising forming one or more openings within a first dielectric layer disposed on a substrate, growing layers comprising a first III-N material on the substrate within the one or more openings of the first dielectric layer, growing islands comprising a second III-N material within the one or more openings over the layers comprising a first III-N material, the islands extend over a length of the substrate, the islands comprise a top surface, heating the islands to form a sloped sidewall by thermal decomposition of the islands, and growing caps that extend laterally from the top surfaced of the islands and overhang the sloped sidewall of the island.

Example 36 includes all of the features of example 35, further comprising growing a second dielectric layer over the first dielectric layer, wherein an interface is formed between the second dielectric layer and the sidewall of first islands.

Example 37 includes all of the features of example 36, wherein growing a second dielectric layer over the first dielectric layer comprises growing a second dielectric layer having a high surface tension to develop a tensile stress at the interface between the second dielectric layer and the first islands, wherein the first islands cleave to form second islands and third islands from the sidewall of the first islands, with the first islands therebetween.

Example 38 includes all of the features of example 36, wherein growing the first islands comprising a second III-N material within the one or more openings over the layers comprising a first III-N material comprises growing the first islands temperatures between 600 C to 1000 C.

Example 39 includes all of the features of example 37, wherein heating the islands to form a sloped sidewall by thermal decomposition of the islands comprises heating the III-N islands to a temperature of 1000 C or more in a hydrogen atmosphere having a low ammonia content.

Example 40 includes all of the features of example 39, wherein heating the islands to form a sloped sidewall by thermal decomposition of the first islands further comprises forming second islands and third islands from the sidewall of the first islands, with the first islands therebetween, wherein the second islands and third islands are formed by lateral cleavage of the first islands have a tensile stress at the interface between the second dielectric layer and the sidewall of the first islands wherein the cleavage is induced by the thermal decomposition of the first islands.

Example 41 includes all of the features of example 36, growing the caps that extend laterally from the top surface of the first islands comprises lateral epitaxial overgrowth from the top surface of the first islands.

Example 42 includes all of the features of example 40, wherein the lateral epitaxial overgrowth of the caps is carried out at a temperature of 1000 C or more.

Example 43 includes all of the features of example 36, wherein the composition of the III-N layer is one of AlN or AlGaN.

Example 44 includes all of the features of example 36, The method of claim 37, wherein the composition of the III-N caps is GaN.

Example 45 includes all of the features of example 36, wherein composition of the III-N islands is one of GaN or AlN.

Example 46 includes all of the features of example 36, further comprising growing a device layer over the III-N islands.

Example 47 includes all of the features of example 46, wherein the device layer composition is one of InGaN, AlN, or AlInN.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A microelectronic device, comprising:
a first structure over a substrate and adjacent to a second structure of lesser lateral width than the first structure, the first and second structures each comprising a III-N material of a first chemical composition, and at least the first structure having a sloped sidewall; and
a cap on a top surface of the first structure, wherein the cap comprises another III-N material, and wherein the cap cantilevers laterally from the top surface of the first structure, extending laterally beyond the sidewall of the first structure and over a space between the first structure and the second structure.

2. The device of claim 1, wherein the first structure extends over a length of the substrate and the cap extends over the first structure along the length.

3. The device of claim 1, wherein the device further comprises a third structure wherein the second and third structures extend the length over the substrate and the cap extends over at least a portion of the second structure or third structure.

4. The device of claim 1, wherein the cap is absent from over the second structure.

5. The device of claim 1, further comprising a dielectric material within the space between the first structure and the second structure.

6. The device of claim 1, wherein the second structure has a first sidewall adjacent to the first structure, and wherein the first sidewall has a steeper slope than the sidewall of the first structure.

7. The device of claim 1, wherein the cap has a different composition than the first composition, the first structure extends from a seed layer comprising a III-N material on the substrate, and the seed layer has a different composition than the first composition.

8. The device of claim 1, further comprising at least one layer on the cap, the at least one layer comprising a III-N material having a different composition than the cap.

9. The device of claim 1, wherein the first and second structures are substantially monocrystalline and have the same crystallographic orientation, and wherein the cap has a thickness of 1-50 nanometers and width of 1-20 micrometers.

10. The device of claim 9, wherein at least one of the cap or the first composition is one of GaN, AlN, InN, AlGaN, InAlN, or InGaN.

11. A system, comprising:
a memory; and
a processor coupled to the memory, the processor comprising the device of claim 1, and one or more device terminals coupled to the cap.

12. The system of claim 11, wherein the device comprises one of a transistor, a light emitting diode, or a resonator.

13. The system of claim 11, wherein:
the device comprises a transistor, and wherein:
a polarization layer extends over the cap, and the polarization layer comprises at least one of AlN, AlGaN or InAlN and has a composition distinct from the cap; or
the device comprises the light-emitting diode, and wherein:
a quantum well structure extends over a portion of the cap, and the quantum well structure comprises alternating layers of III-N material having different bandgaps, and the quantum well structure comprises an InGaN alloy having a composition that ranges from 5% to 40% indium.

14. The system of claim 13, wherein the device comprises the transistor, and wherein the one or more device terminals coupled to the cap comprise:
a gate electrode over at least a portion of a dielectric layer that extends over one or more portions of the polarization layer;
a source electrode over a source region, the source region adjacent to a first side of the dielectric layer; and
a drain electrode over a drain region, the drain region adjacent to a second side of the dielectric layer, wherein the source region and the drain region extend from the dielectric layer along a width or length of the cap.

15. The system of claim 12, wherein the device comprises the resonator, the cap comprises AlN, and the one or more device terminals include regions comprising silicon.

16. The system of claim 11, wherein the cap extends laterally over a first space between the first structure and the second structure, and extends laterally over a second space between the first structure and a third, adjacent, structure, the third structure of lesser width than the first structure.

* * * * *